United States Patent [19]
Ueno

[11] Patent Number: 6,072,850
[45] Date of Patent: Jun. 6, 2000

[54] FREQUENCY DIVIDER

[75] Inventor: Naoki Ueno, Tochigi-ken, Japan

[73] Assignee: Nippon Precision Circuits Inc., Tokyo, Japan

[21] Appl. No.: 09/196,079

[22] Filed: Nov. 18, 1998

[30] Foreign Application Priority Data

Nov. 19, 1997 [JP] Japan .................................... 9-317861

[51] Int. Cl.⁷ .................................................. H03K 3/289
[52] U.S. Cl. ............................................. 377/47; 327/202
[58] Field of Search ................................ 377/47; 327/202

[56] References Cited

U.S. PATENT DOCUMENTS 4,703,495 10/1987 Bereznak ................................... 377/47
5,172,400 12/1992 Maemura .................................. 377/47

*Primary Examiner*—Margaret R. Wambach
*Attorney, Agent, or Firm*—Amster, Rothstein & Ebenstein

[57] ABSTRACT

There is disclosed a frequency divider that operates at an improved operating speed and provides frequency division given with a frequency division ratio of N, where N is an odd number. The frequency divider comprises first, second, and third stages of D-type flip-flops. The first stage selects either the output from the second stage or the output from the third stage according to the logic level of the output from the third stage. Delay is eliminated from between the first and third stages and from between the first and second stages. Consequently, the operating frequency can be enhanced.

5 Claims, 24 Drawing Sheets

FREQUENCY DIVIDER

FIELD OF THE INVENTION

The present invention relates to a frequency divider.

DESCRIPTION OF THE PRIOR ART

In the current PLL frequency synthesizer technique, there is a demand for dual modulus prescalers having higher frequency operating capability. One conventional dual modulus prescaler is shown in FIG. 22 and comprises a frequency divider X1 capable of operating at a high speed and varying the frequency division ratio, a frequency division ratio extender X2 receiving the output from the frequency divider X1 and operating at a lower speed, and a modulus control circuit X3 for controlling the frequency division ratio.

The frequency divider X1 consists of D-type flip-flops f1–f3. The noninverting output terminal of each D-type flip-flop is designated Q. An inverting output terminal producing an output inverted with respect to the output from the noninverting output Q is designated $\overline{Q}$. An input terminal through which data is entered is designated D. These operate on a common clock signal. The clock terminal of each D-type flip-flop is designated C. For convenience, each D-type flip-flop is shown to have one clock terminal and one input terminal. Inverses of the signals applied to these clock terminal C and input terminal D are also used. If necessary, terminals to which these inverses are applied will be designated $\overline{C}$ and $\overline{D}$, respectively. In all D-type flip-flops described later, like terminals will be denoted by like reference numerals. These D-type flip-flops f1–f3 are cascaded. The output of the second stage of D-type flip-flop f2 and the output of the third stage of D-type flip-flop f3 are applied as input data to the first stage of D-type flip-flop f1 via an OR gate or 1. The output of the first stage of D-type flip-flop f1 is connected with the frequency division ratio extender X2. This frequency divider X1 operates as given by $$q_2^{n+1} = q_1^n$$

$$q_3^{n+1} = q_2^n$$

$$q_1^{n+1} = \overline{(q_2^n + q_3^n)}$$

where $q_1^n$, $q_2^n$, and $q_3^n$ are outputs from the D-type flip-flops f1–f3, respectively, in response to the nth clock pulse. That is, in response to every clock pulse, the outputs from the D-type flip-flops f1–f3 assume the following states:

$(q_1^{n-2}, q_2^{n-2}, q_3^{n-2}) = (0, 0, 0)$
$(q_1^{n-1}, q_2^{n-1}, q_3^{n-1}) = (1, 0, 0)$
$(q_1^n, q_2^n, q_3^n) = (1, 1, 0)$
$(q_1^{n+1}, q_2^{n+1}, q_3^{n+1}) = (0, 1, 1)$
$(q_1^{n+2}, q_2^{n+2}, q_3^{n+2}) = (0, 0, 1)$
$(q_1^{n+3}, q_2^{n+3}, q_3^{n+3}) = (0, 0, 0)$

Subsequently, the similar operations are repeated to accomplish a frequency division with frequency division ratio of 5, in other word divisor of 5.

When a frequency division with frequency division ratio of 4 is performed by the frequency divider X1, the output from the modulus control circuit X3 resets the third stage of D-type flip-flop f3. In response to every clock pulse, the outputs from the D-type flip-flops f1–f3 assume the following states sequentially:

$(q_1^{n-2}, q_2^{n-2}, q_3^{n-2}) = (0, 0, 0)$
$(q_1^{n-1}, q_2^{n-1}, q_3^{n-1}) = (1, 0, 0)$
$(q_1^n, q_2^n, q_3^n) = (1, 1, 0)$
$(q_1^{n+1}, q_2^{n+1}, q_3^{n+1}) = (0, 1, 0)$
$(q_1^{n+2}, q_2^{n+2}, q_3^{n+2}) = (0, 0, 0)$ Subsequently, similar operations are carried out to perform the frequency division with frequency division ratio of 4.

The D-type flip-flop fi is specifically shown in FIG. 23. This is a master-slave D-type flip-flop. This has a master circuit Y1 comprising a differential circuit Y2 acting as a data input portion, another differential circuit Y3 acting as a data-holding-and-output portion, and a switching circuit Y5 supplying current from a constant-current circuit Y4 to the differential circuits Y2 and Y3 alternately.

The differential circuit Y2 consists of bipolar transistors tr1 and tr2 having their emitters connected together. Data represented by mutually inverted signals are supplied to their collectors. Outputs are produced from their collectors. The bipolar transistors will hereinafter be referred to simply as the transistors. The collectors of these transistors tr1 and tr2 are connected with a power terminal VCC via resistors r1 and r2. The differential circuit Y2 receives input data that are mutually inverted signals via input terminals D and $\overline{D}$. The differential circuit Y3 consists of transistors tr3 and tr4 having their bases and collectors cross-coupled. The collectors of the transistors tr3 and tr4 of the differential circuit Y3 are connected with the collectors of the transistors tr1 and tr2 of the differential circuit Y2, receive the output from the differential circuit Y2, and hold it. The constant-current circuit Y4 consists of a transistor tr5 having a base that receives a signal from a current value-setting terminal VCS. The emitter of the transistor tr5 is connected with a power terminal GND. The switching circuit Y5 consists of a pair of transistors tr6, tr7 whose collectors are connected with the emitter junctions Ce1 and Ce2 of the differential circuits Y2 and Y3, respectively. The emitters of these transistors tr5 and tr6 are connected with the constant-current circuit Y4. The bases of the transistors tr6 and tr7 receive clock signals that are mutually inverted signals via the clock terminals C and $\overline{C}$. These transistors tr6 and tr7 are alternately turned on and supply currents to the differential circuits Y2 and Y3, respectively.

A slave circuit Y6 is similar in configuration to the master circuit Y1. Transistors tr8 and tr9 form a data input portion of the differential circuit Y7 in the slave circuit Y6. The bases of the transistors tr8 and tr9 are connected with the collectors of the transistors tr3 and tr4 of the differential circuit Y3 of the master circuit Y1. These bases receive output data held in the differential circuit Y3. The output portion of the differential circuit Y8 is formed by transistors tr10 and tr11 in the slave circuit Y6. The collectors of the transistors tr10 and tr11 are connected with output terminals $\overline{Q}$ and Q. respectively. The base of a transistor tr12 of the constant-current circuit Y9 is connected with the current value-setting terminal VCS in common with the base of the transistor tr5 of the constant-current circuit Y4. In this way, substantially the same currents are supplied to the differential circuits of the master circuit Y1 and the slave circuit Y6. A switching circuit Y10 consists of transistors tr13 and tr14 whose collectors are connected with the emitter junctions Ce3 and Ce4 of the differential circuits Y7 and Y8, respectively. The emitters of the transistors tr13 and tr14 are both connected with the collector of the transistor tr12 in the constant-current circuit Y9. The bases of the transistors tr13 and tr14 receive clock signals via the clock terminals $\overline{C}$ and C, respectively, are alternately turned on, and supply currents to the differential circuits Y7 and Y8, respectively.

In the D-type flip-flops shown in FIG. 23 and constructed as described thus far, the differential circuit Y2 writes input data from the input terminals D and $\overline{D}$ in response to "1" of the clock signal from the clock terminal C. At the same time, the differential circuit Y8 holds the output data from the differential circuit Y7. Subsequently, it responds to "1" of the clock signal at the clock terminal that is the inverse of the clock signal at the clock terminal C. The differential circuit Y3 holds the output data from the differential circuit Y3. Concurrently, the differential circuit Y7 writes the output data from the differential circuit Y3.

The operation of these switching circuits Y5 and Y10 is as follows. The transistors tr6 and tr14 are simultaneously turned on and off. Similarly, the transistors tr7 and tr13 are simultaneously turned on and off. When the transistors tr6 and tr14 are conducting, the transistors tr7 and tr13 are cut off, and vice versa. The states are switched simultaneously.

The term "turning on and off" is used in the same sense in the description given below. However, the term becomes vague at higher frequencies. For example, even when the transistors tr6 and tr7 are simultaneously conducting, if the transistor tr6 is more heavily conducting than the transistor tr7, it will be said that "the transistor tr6 is conducting, while the transistor tr7 is cut off."

The OR gate or 1 may be a wired-OR circuit as shown in FIG. 24. This wired-OR circuit has a terminal Din1 directly connected with the base of one transistor tr1 of the differential circuit Y2. A transistor tr15 is connected in parallel with this transistor tr1. Another terminal Din2 is directly connected with the base of this transistor tr15. A terminal VBB for applying a reference potential is connected with the base of the other transistor tr2 of the differential circuit Y2.

In this frequency divider where such D-type flip-flops are cascaded, the delay time of the gates between the D-type flip-flops must be within the period of one clock pulse; otherwise a malfunction would take place. In the frequency divider X1, the outputs from the second and third stagesof D-type flip-flops f2 and f3, respectively, are applied to the first stage of D-type flip-flop f1 via the OR gate to achieve the frequency division with frequency division ratio of 5. The delay introduced by this OR gate has impeded increases in the operating frequency.

Where this OR gate is made up ofa wired-OR circuit as shown in FIG. 24, a reference potential must be impressed on one side. Therefore, the input side is a single end. Accordingly, an input signal having an appropriate amplitude value that is at least twice the differential input needs to be applied. Consequently, the output portion of the previous stage of D-type flip-flop is required to swing the amplitude to a corresponding value. Equivalently, delay takes place.

Because of the structure of the D-type flip-flops shown in FIG. 23, it is impossible to compensate for the propagation delay time. This makes very difficult to promote high-speed operation.

For example, it is assumed that the transistor tr7 is turned on, and that old data held in the differential circuit Y3 is updated with new, or inverted, input data in response to activation of the transistor tr6. If the transistor tr7 is driven off and, at the same time, the transistor tr6 is driven on, the differential circuit Y3 keeps old data for a short time because of the presence of propagation time. Therefore, extra load necessary to invert the old data is imposed on the new input data. If no old data is present and writing is done, it is not necessary to invert the data. Therefore, the load consists only of writing data. The data can be written in a shorter time. In practice, however, a longer time is required to write data because of the extra load. As the operating frequency increases, the writing operation cannot follow the clock signal.

SUMMARY OF THE INVENTION

The present invention is intended to provide a frequency divider free of the foregoing problems.

In a frequency divider in accordance with the present invention, the first stage of D-type flip-flop is designed to selectively accept outputs from the Nth and (N−1)th stage of D-type flip-flops according to the logic level of the output from theNthstage of D-type flip-flop. Thus, delay is eliminated from between the first and the Nth stage of D-type flip-flop and from between the first and the(N−1)th stage of D-type flip-flop. In consequence, the operating frequency is enhanced.

Each D-type flip-flop has an input portion for accepting data and an output portion for holding and producing the input data. Electric current is supplied to the input portion and the output portion according to first and second clock signals, respectively, whether the circuit is a master circuit or a slave circuit. The first clock signal is delayed by a given amount with respect with the second clock signal. The timing at which input data is written and the timing at which data is held are optimized. The operating frequency of the D-type flip-flops is increased.

The present invention provides a frequency divider comprising N (three or greater integer) stages of D-type flip-flops cascaded. Data is cyclically shifted according to the input clock signal to achieve frequency division of the clock signal. The first stage of D-type flip-flop selectively accepts the outputs from the Nth and (N−1)th stages of D-type flip-flops according to the logic level of the output from the Nth D-type flip-flop. In this way, a frequency division with frequency division ratio of (2N−1) is accomplished.

In the frequency divider described above, data in every D-type flip-flop assumes a first logic level in response to every (2N−1) clock pulses. The first stage of D-type flip-flop accepts the output from the (N−1)th stage of D-type flip-flop when the output from the Nth stage of D-type flip-flop is preferably at the first logic level. When the output from the Nth stage of D-type flip-flop is at a second logic level, the first stage of D-type flip-flop preferably accepts the output from the Nth stage of D-type flip-flop.

When the output from the Nth D-type flip-flop is switched, it is desired to supply data of the same logic level to the inputs of the first stage of D-type flip-flop, whether the output from the Nth stage or the output from the (N−1)th stage is selected.

The first stage of D-type flip-flop is preferably composed of first, second, and third differential circuits. The first differential circuit produces an output according to the output from the (N−1)th stage of D-type flip-flop. The second differential circuit produces an output according to the output from the Nth stage of D-type flip-flop.

The third differential circuit supplies complementary currents to the first and second differential circuits according to the output from the Nth stage of D-type flip-flop. The outputs of the first and second differential circuits which assume the same logic levels as their inputs are coupled together. The outputs that are the inverses of the above-described inputs are coupled together, thus forming the first input portion accepting complementary data items.

The first stage of D-type flip-flop is of the master-slave type and consists of a first master circuit and a first slave circuit. The first master circuit comprises the first input portion described above and a first output portion consisting of a fourth differential circuit for holding the data entered into the first input portion and producing it as an output. The first slave circuit comprises a second input portion and a second output portion. The second input portion consists of a fifth differential circuit for accepting the output from the first master circuit. The second output portion consists of a sixth differential circuit for holding the data entered into the second input portion and producing it to the next stage of D-type flip-flop. The second and following stages of D-type flip-flops are of the master-slave type, and each consists of a second master circuit and a second slave circuit. The second master circuit comprises a third input portion and a third output portion. The third input portion consists of a seventh differential circuit for accepting the output from the previous stage. The third output portion consists of an eighth differential circuit for holding data applied to the third input portion and producing it as an output. The second slave circuit comprises a fourth input portion and a fourth output portion. The fourth input portion consists of a ninth differential circuit for accepting the output from the second master circuit. The fourth output portion consists of a tenth differential circuit for holding the output from the second master circuit and producing it to the following stage of D-type flip-flop. The first and second input portions supply electric currents to the second and fifth differential circuits respectively and alternately according to the first clock signal. The first and second output portions supply electric current to the fourth and sixth differential circuits respectively and alternately according to the second clock signal. The third and fourth input portions supply electric currents to the seventh and ninth differential circuits, respectively, according to the first clock signal in synchronism with the supply of electric current to the first or second differential circuit and the supply of electric current to the fifth differential circuit. The third and fourth output portions supply electric currents to the eighth and tenth differential circuits, respectively, according to the second clock signal in synchronism with the supply of electric current to the fourth and sixth differential circuits, respectively. Preferably, the first clock signal is delayed by a given amount with respect to the second clock signal.

Other objects and features of the invention will appear in the course of the description thereof, which follows.

DESCRIPTION OF THE PREFERRED EMBODIMENTS

Figure 1:
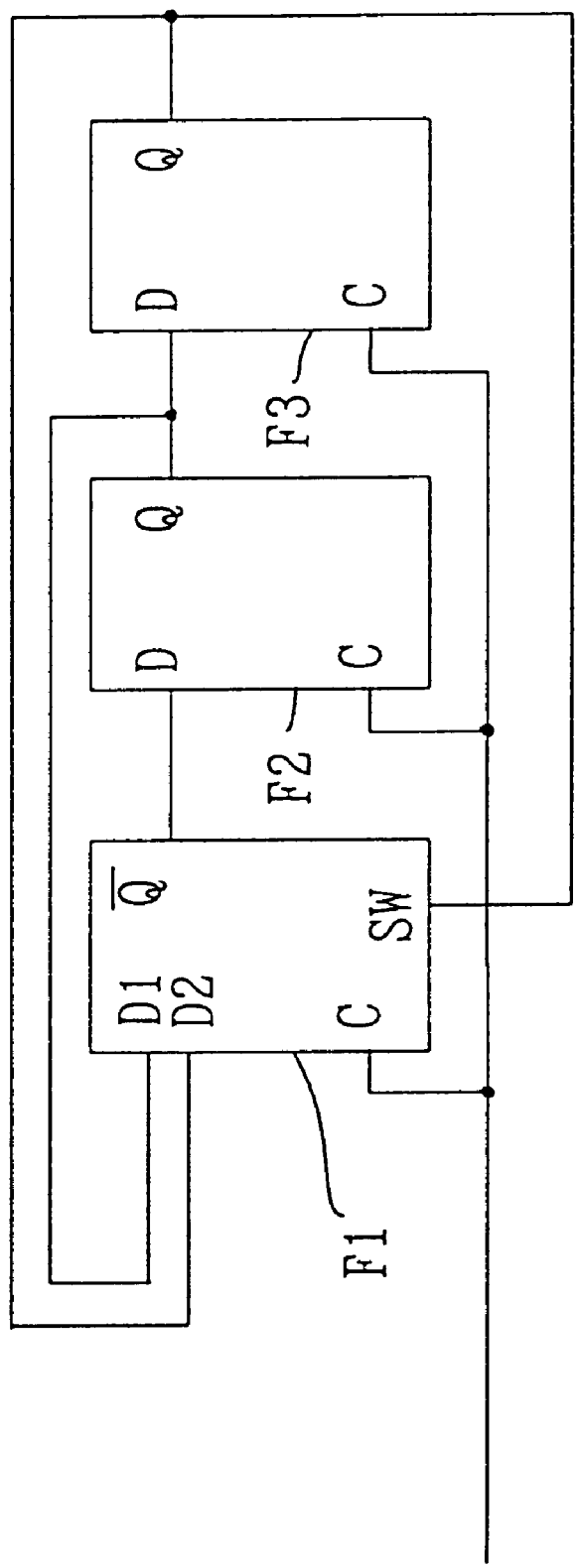
FIG. 1 is a circuit diagram of a frequency divider according to a first embodiment of the present invention.

A frequency divider in accordance with a first embodiment of the present embodiment is next described by referring to FIG. 1. This frequency divider achieves the frequency division with frequency division ratio of 5. In FIG. 1, D-type flip-flops F1–F3 are cascaded and act to shift data sequentially in response to incoming clock signals. The first stage of D-type flip-flop F1 inverts the logic level of the input data and produces the inverted data to the next stage. This first stage F1 has a terminal SW receiving the output from the third stage of D-type flip-flop. The first stage of D-type flip-flop F1 selectively accepts the outputs from the second and third stages of D-type flip-flops F2, F3 according to the logic level of the signal received at the terminal SW of the first stage of D-type flip-flop F1. In this example, it is assumed that the output from the third stage of D-type flip-flop is at level 0. The output from the second stage of D-type flip-flop F2 is accepted as input data. If the output from the third stage of D-type flip-flop F3 is at level 1 (i.e., a certain low potential higher than level 0), the output from the third stage of D-type flip-flop F3 is accepted. That is, when the logic level of the output from the third stage of D-type flip-flop F3 is switched, the same logic level of data is supplied to the input of the first stage of D-type flip-flop, whether the output from the third stage or the output from the second stage is selected. The first stage of D-type flip-flop is similar to the conventional D-type flip-flop except for its input portion. The second and third stages of D-type flip-flops are the same as the conventional structure shown in FIG. 23.

It is assumed that the D-type flip-flops F1–F3 produce outputs $Q_1^n$, $Q_2^n$, and $Q_3^n$, respectively, in response to the nth clock pulse. The outputs from these D-type flip-flops F1–F3 are cycled between different logic levels in response to every clock pulse as given below. Thus, the frequency division with frequency division ratio of 5 is achieved.

$(Q_1^{n-2}, Q_2^{n-2}, Q_3^{n-2}) = (0, 0, 0)$ $(Q_1^{n-1}, Q_2^{n-1}, Q_3^{n-1}) = (1, 0, 0)\ Q_1^{n-1} = \overline{Q_2^{n-2}}(=\overline{Q_3^{n-2}})$ $(Q_1^n, Q_2^n, Q_3^n) = (1, 1, 0)\ Q_1^n = \overline{Q_2^{n-1}}(=\overline{Q_3^{n-1}})$ $(Q_1^{n+1}, Q_2^{n+1}, Q_3^{n+1}) = (0, 1, 1)\ Q_1^{n+1} = \overline{Q_2^n}$ $(Q_1^{n+2}, Q_2^{n+2}, Q_3^{n+2}) = (0, 0, 1)\ Q_1^{n+2} = \overline{Q_3^{n+1}}(=\overline{Q_2^{n+1}})$ $(Q_1^{n+3}, Q_2^{n+3}, Q_3^{n+3}) = (0, 0, 0)\ Q_1^{n+3} = \overline{Q_3^{n+2}} = Q_1^{n-2}$ For example, when he logic level of the output $Q_3^n$ of the third stage of D-type flip-flop F3 in response to the nth clock pulse is 0. The first stage of D-type flip-flop F1 selects the output $Q_2^n$ of logic level 1 as input data. The inverted level, or 0, is produced in response to the next (n+1)th clock pulse. Therefore, no delay element is contained between the first stage of D-type flip-flop F1 and the second stage of D-type flip-flop F2, unlike in the prior art technique. Hence, higher-speed operation is possible.

In response to the (n+1)th clock pulse, the output $Q_3^{n+1}$ from the third stage of D-type flip-flop F3 takes logic level 1. At this time, the outputs $Q_2^{n+1}$ and $Q_3^{n+1}$ from the second and third stages of D-type flip-flops F2 and F3 assume logic level 1 in response to the (n+1)th clock pulse. Whether the output $Q_2^{n+1}$ or $Q_3^{n+1}$ is input to the first stage of D-type flip-flop F1, the output from the first stage of D-type flip-flop F1 assumes logic level 0 in response to the next (n+2)th clock pulse. That is, the output from the third stage of D-type flip-flop used for switching of the input data may also be at the same logic level as the output $Q_3^n$ of level 0, when the nth clock pulse is produced. In other words, delay of 1 clock pulse is allowed for the operation to switch the input data in response to the output from the third stage of D-type flip-flop.

In response to the (n+2)th clock pulse, the first stage of D-type flip-flop F1 accepts the output $Q_3^{n+2}$ of logic level 1 from the third stage of D-type flip-flop F3 as its input data according to the output from the third stage of D-type flip-flop F3 that has assumed logic level 1 since the (n+1)th clock pulse. In response to the next (n+3)th clock pulse, the logic level is inverted and delivered. Again, no delay element is introduced between the first stage of D-type flip-flop F1 and the third stage of D-type flip-flop F3.

In response to the (n+3)th clock pulse, the state returns to the state assumed in response to the (n−2)th clock pulse. Again, the logic levels of the outputs $Q_2^{n-2}$ and $Q_3^{n-2}$ from the second and third stages of D-type flip-flops F2 and F3, respectively, are both 0. Hence, the output from the first stage of D-type flip-flop F1 in response to the next (n−1)th clock pulse takes logic level 1, whether the output $Q_2^{n-2}$ or $Q_3^{n-2}$ is accepted. Again, the operation to switch the input data in response to the output from the third stage of D-type flip-flop is allowed to be delayed.

This operation to switch the input data completes in a time sufficiently shorter 1 clock pulse. Consequently, other logic producing delay of the period of 1 clock pulse can be inserted between the output of the third stage of flip-flop F3 and the first stage of flip-flop F1.

The first stage of D-type flip-flop F1 is described in detail below. When the outputs from the second and third stages of D-type flip-flops F2 and F3 are alternately accepted as input data, if the input data is interrupted, a malfunction will take place. Therefore, in the present embodiment, the input portion of the first stage of D-type flip-flop is designed to prevent the input data from being interrupted.

Figure 2:
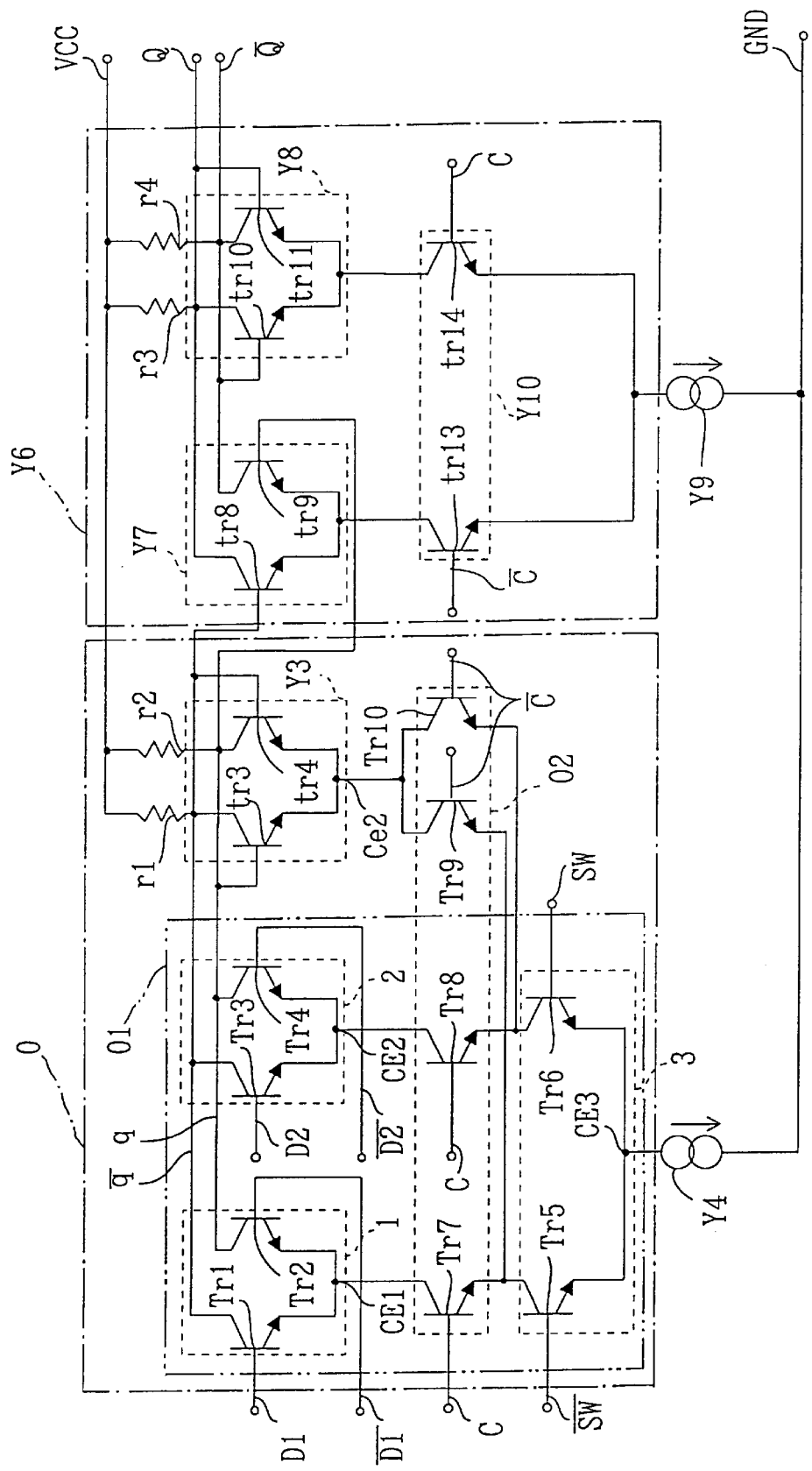
FIG. 2 is a circuit diagram of main portions of the frequency divider shown in FIG. 1.
Figure 23:
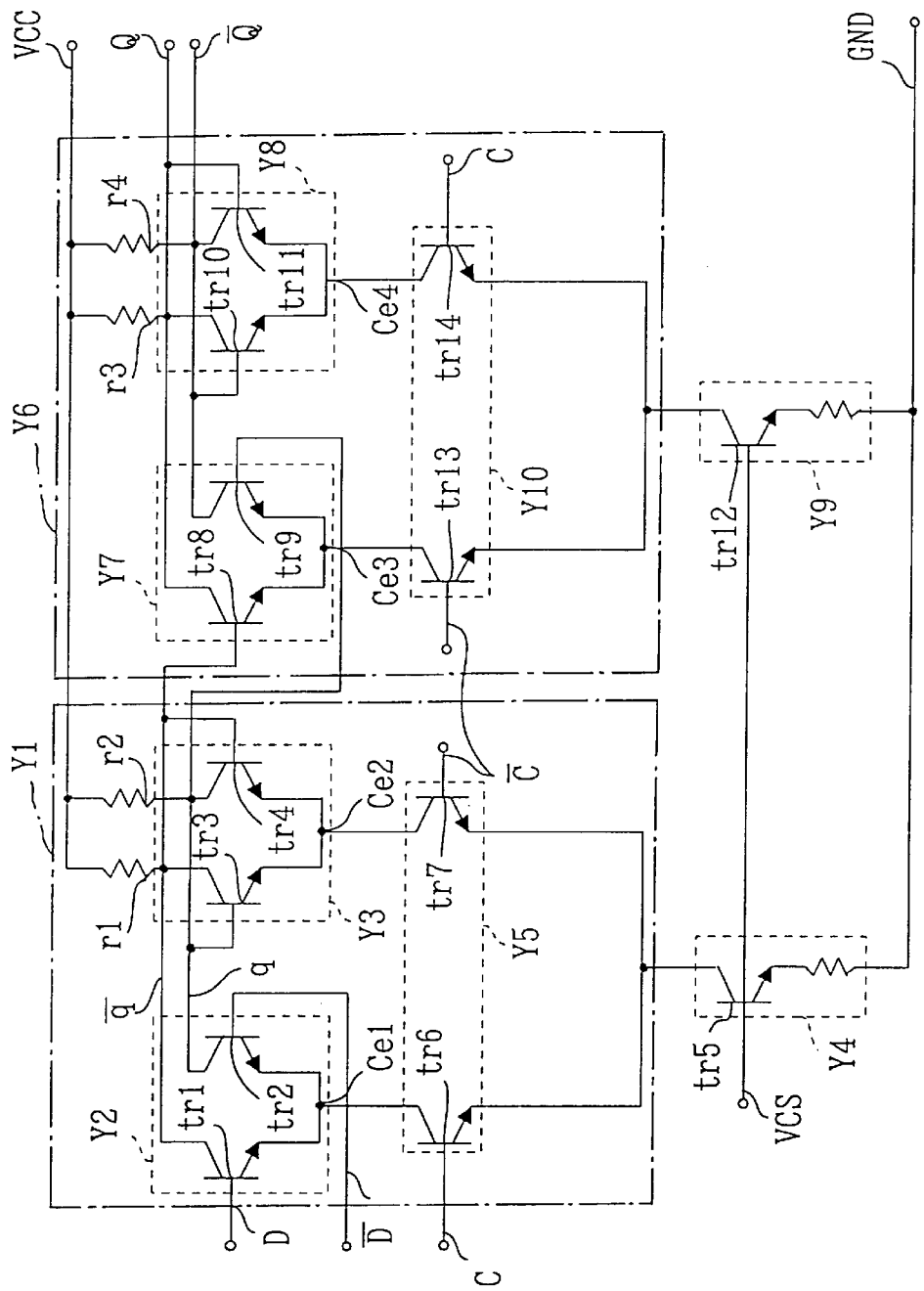
FIG. 23 is a circuit diagram of main portions of the frequency divider shown in FIG. 22.
Figure 24:
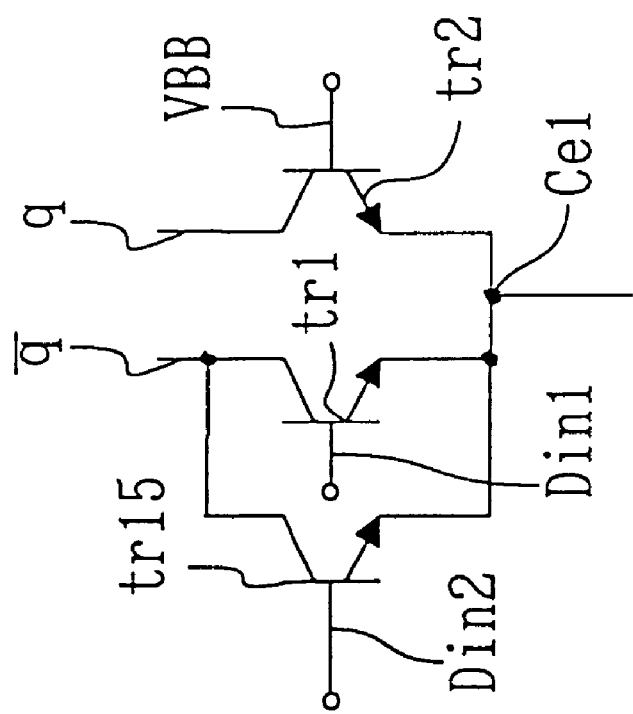
FIG. 24 is a circuit diagram of main portions of the frequency divider shown in FIG. 22.

In FIG. 2, the configuration of the first stage of D-type flip-flop F1 is shown. In this figure, the same constituents as in FIG. 23 are shown by the same numerals as in FIG. 23. The same constituents are shown by the same numerals in figures mentioned hereinafter, unless otherwise specially mentioned. In FIG. 2, the numeral 0 denotes a master circuit and the numeral Y6 denotes a slave circuit. The master circuit 0 comprises an input portion 01 for selectively accepting data from the second stage of D-type flip-flop F2 or from the third stage of D-type flip-flop F3 according to the logic level of output from the third stage of D-type flip-flop F3, the differential circuit Y3 as an output portion for holding and producing the input data, and a switching circuit 02 for alternatively supplying electric current from the constant-current circuit Y4 to the input portion 01 and the differential circuit Y3. The slave circuit Y6, the differential circuit Y3 and the constant-current circuit Y4 are the same constituents as mentioned above.

The input portion 01 comprises a differential circuit 1, a differential circuit 2 and a differential circuit 3. The differential circuit 1 consists of npn bipolar transistors Tr1 and Tr2, of which emitters are connected together, of which bases are connected to input terminals D1 and $\overline{D1}$ so as to accept output from the second stage of D-type flip-flop F2 and inverted signal of that, respectively, and of which collectors are connected to terminals $\bar{q}$ and q, respectively. The differential circuit 2 consists of npn bipolar transistors Tr3 and Tr4, of which emitters are connected together, of which bases are connected to input terminals D2 and $\overline{D2}$ so as to accept output from the third stage of D-type flip-flop F3 and inverted signal of that, respectively, and of which collectors are connected to terminals $\bar{q}$ and q, respectively. The terminal $\bar{q}$ and q are connected to the power terminal VCC via resisters r1 and r2, respectively, so that the input data and the inverted signal of that are generated at the terminal q and $\bar{q}$, respectively, by supplying currents to the resisters r1 and r2 in an operation mentioned after. The differential circuit 3 consists of npn bipolar transistors Tr5 and Tr6, of which emitters are connected together, of which bases are connected to terminals $\overline{SW}$ and SW for a selection, respectively. The terminals SW and $\overline{SW}$ are applied the output from the third stage of D-type flip-flop F3 and the inverted signal of that, respectively. The emitter junction CE1 of the differential circuit 1 is connected to the collector of the transistor Tr5 of the differential circuit 3 via a npn bipolar transistor Tr7 of which the base is applied the clock signal. The emitter junction CE2 of the differential circuit 2 is connected to the collector of the transistor Tr6 of the differential circuit 3 via a npn bipolar transistor Tr8 of which the base is applied the clock signal. The emitter junction CE3 of the differential circuit 3 is the constant-current circuit Y4 to be connected to the power terminal GND via the constant-current circuit Y4.

The switching circuit 02 consists of the transistors Tr7, Tr8 and npn bipolar transistors Tr9, Tr10. The transistor Tr9 has a collector being connected to the emitter junction Ce2 of the differential circuit Y3, an emitter being connected to the collector of the transistor Tr5 and a base being connected the clock terminal $\overline{C}$. The transistor Tr9 controls the supplying of electric current to the differential circuit Y3 when the input data from the input terminal D1 and $\overline{D1}$ are selected. The transistor Tr10 has a collector being connected to the emitter junction Ce2 of the differential circuit Y3, an emitter being connected to the collector of the transistor Tr6 and a base being connected the clock terminal $\bar{c}$. The transistor Tr10 controls the supplying of electric current to the differential circuit Y3 when the input data from the input terminal D2 and $\overline{D2}$ are selected.

The operation of the D-type flip-flop circuit shown in FIG. 2 is described. When the clock signal assumes level 1, the transistors Tr7 and Tr8 conduct, thus connecting the differential circuits 1, 2 with the differential circuit 3. For convenience, when the collectors and the emitters of the transistors Tr7 and Tr8 are connected with a higher potential and a lower potential, respectively, and turned on, they are referred to as conducting. In practice, when the transistor Tr5 is conducting, the transistor Tr7 is conducting. When the transistor Tr6 is conducting, the transistor Tr8 is conducting. In either case, when the clock signal assumes level 1, any one of the outputs from the second and third stages of D-type flip-flop F2 and F3, respectively, can be accepted.

It is first assumed that the output from the third stage of D-type flip-flop F3 takes logic level 0 and that the terminal SW assumes the same logic level. At this time, the transistors Tr5 and Tr6 of the differential circuit 3 are turned on and off, respectively. Electric current is supplied to the differential circuit 1 from the constant-current source via the differential circuit 3. If the output from the second stage of D-type flip-flop F2 assumes logic level 1, the transistors Tr1 and Tr2 of the differential circuit 1 are turned on and off, respectively. The terminal $\bar{q}$ takes level 0, while the terminal q assumes level 1. The terminals q and $\bar{q}$ produce logic levels 1 and 0, respectively, corresponding to the logic level 1 and its inverse 0 of the output from the second stage of D-type flip-flop F2. Conversely, if the output from the second stage of D-type flip-flop F2 assumes logic level 0, the bipolar transistors Tr1 and Tr2 are turned off and on, respectively. The terminals $\bar{q}$ and q take logic levels 1 and 0, respectively. The terminals q and $\bar{q}$ produce logic levels 0 and 1, respectively, corresponding to the logic level 0 and its inverse 1 of the outputs from the second stage of D-type flip-flop F2. When the clock signal subsequently assumes state 0, the transistors Tr7 and Tr9 are turned off and on, respectively. Electric current is supplied to the differential circuit Y3, holding the logic levels of the terminals q and $\bar{q}$. An output is produced to the slave circuit Y6. As the logic level of the signal supplied to the terminal SW is increasing from 0 to 1, the amounts of current flowing into the transistors Tr3 and Tr6, respectively, increase. The amounts of current flowing into the transistors Tr1 and Tr5 decrease. During this time interval, a constant current that is equal to the sum of these currents flows through a resistor R1 so that the logic level of the terminal $\bar{q}$ is maintained at 0.

It is assumed that the signal supplied to the terminal SW is not delayed with respect to the output from the third stage of D-type flip-flop F3. Under the initial condition, the signal supplied to the terminal SW takes logic level 1. And then this signal changes to level 0. At this time, the output from the second stage of D-type flip-flop F2 assumes logic level 0. As the amounts of currents flowing into the transistors Tr4 and Tr6 decrease, the amounts of currents flowing into the transistors Tr2 and Tr5 increase, and the terminal q assumes logic level 0. The transistors Tr3 and Tr6 conduct less heavily, and the amounts of currents flowing into them decrease. The terminal assumes logic level 1.

It is now assumed that the signal supplied to the terminal SW takes logic level 0 in the initial state and goes to 1. At this time, the output from the second stage of D-type flip-flop F2 assumes logic level 1. First, the amounts of currents flowing into the transistors Tr2 and Tr5 decrease. Also, the amount of current flowing into the transistor Tr4 decreases and thus the terminal q assumes logic level 1. As the amounts of currents flowing into the transistors Tr1 and Tr5 decrease, the amounts of currents flowing into the transistors Tr3 and Tr6 increase. In consequence, the terminal $\bar{q}$ takes on logic level 0. In this way, the data input to the input portion 01 shown in FIG. 2 is not interrupted irrespective of the timing at which the input data is switched.

Figure 3:
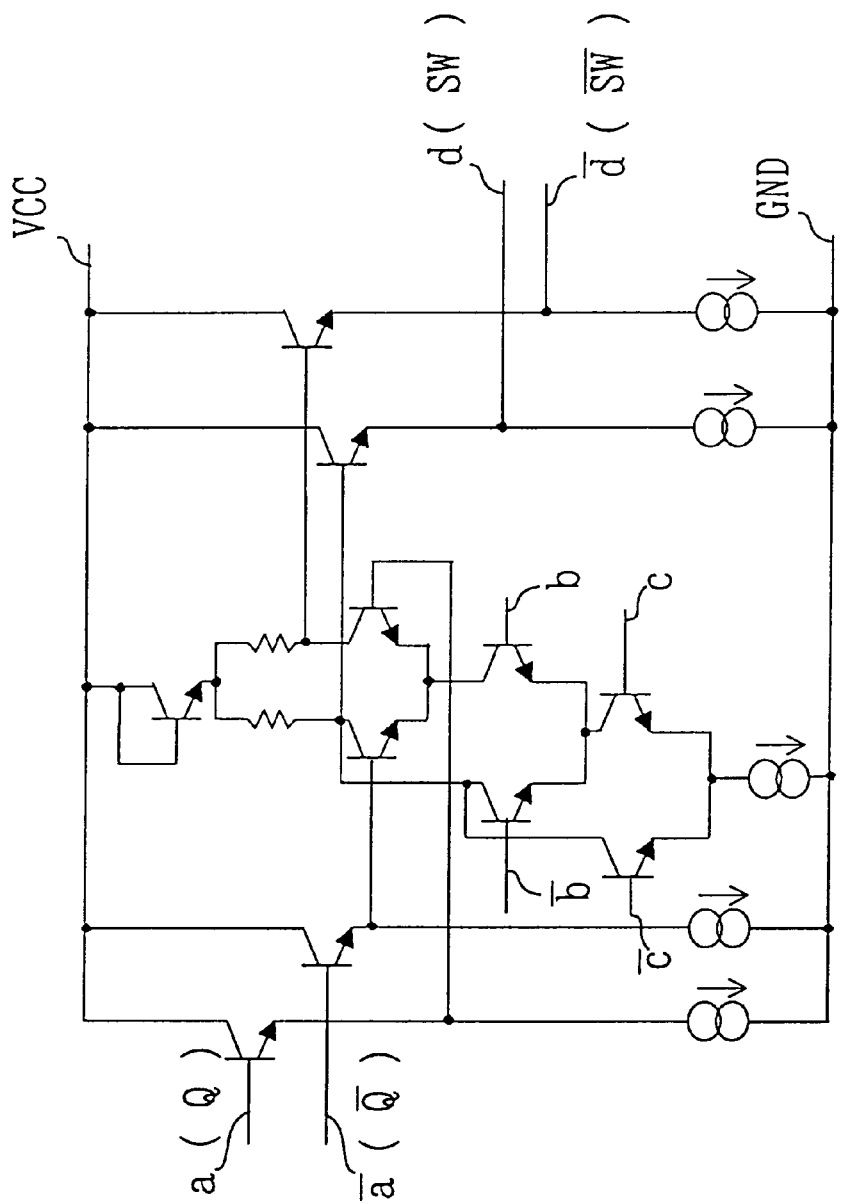
FIG. 3 is a circuit diagram of an example of application of the first embodiment described above.

As described above, in the present embodiment, no delay element is contained between the first stage of D-type flip-flop F1 and the second stage of D-type flip-flop F2 or the third stage of D-type flip-flop F3, it being noted that the second and the third stages of D-type flip-flop are input data sources. Therefore, the operating frequency of the frequency divider can be enhanced. In addition, the output from the third stage of D-type flip-flop F3 used to switch the input data may take the state that is one clock pulse earlier. The signal can be applied to the first stage of flip-flop F1 via other logic involving delay. In other words, other logic can be activated without lowering the operating frequency. For instance, a logic circuit of three-valued input as shown in FIG. 3 can be incorporated. This logic circuit is only simply described. The logic circuit has noninverting input terminals a, b, c and d and inverting input terminals $\bar{a}$, $\bar{b}$, $\bar{c}$ and $\bar{d}$ for accepting the inverses of the signals applied to the terminals a, b, c and d, respectively. When expressed logically, the following relation holds between the logical levels of these terminals:

$$d = a \cdot b \cdot c \text{ or } \bar{d} = \bar{a} + \bar{b} + \bar{c}$$

Figure 4:
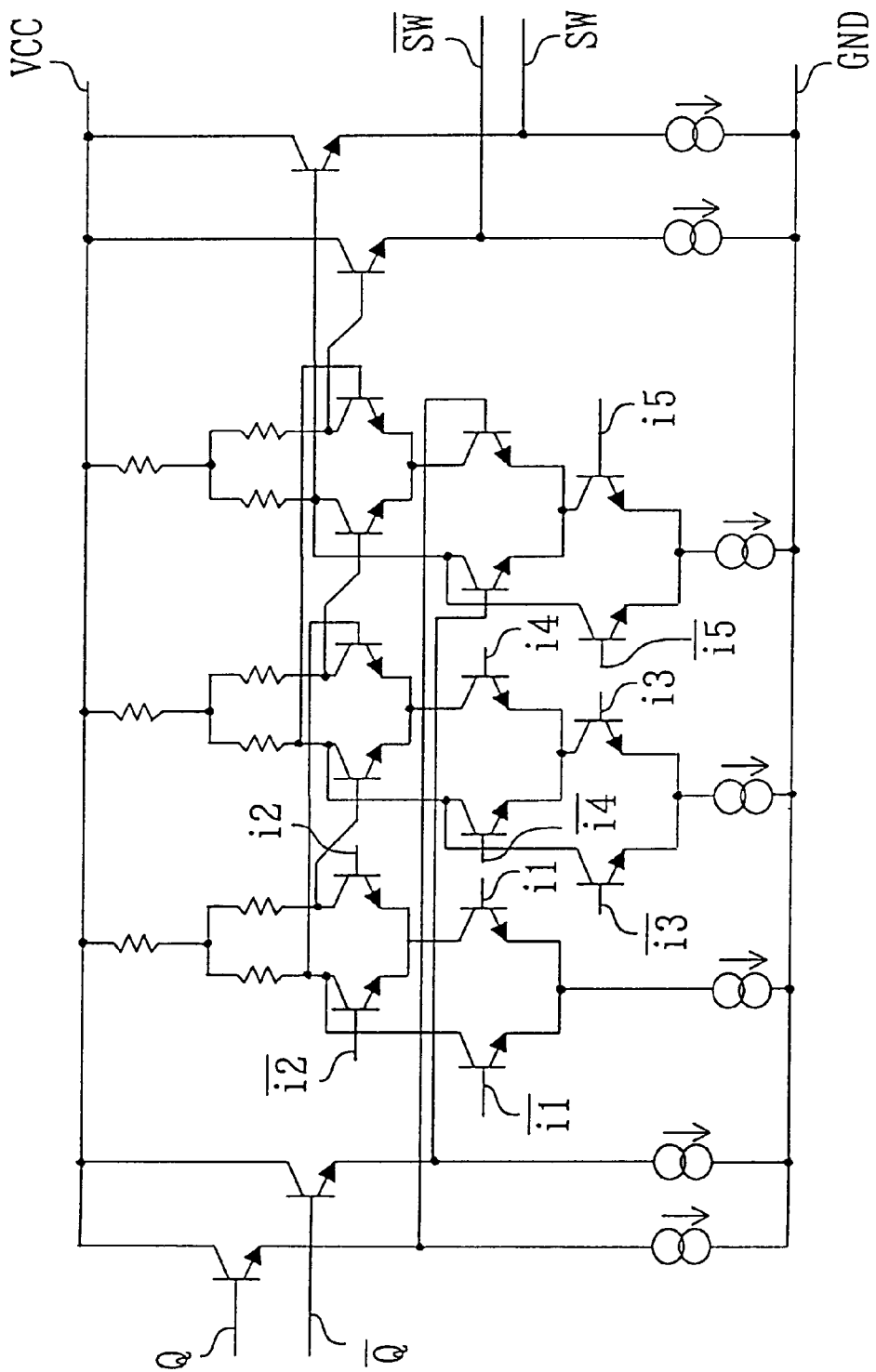
FIG. 4 is a circuit diagram of another example of application of the first embodiment described above.

The terminals a and $\bar{a}$ are connected with Q and $\bar{Q}$, respectively. The terminals d and $\bar{d}$ are connected with the terminals SW and $\overline{SW}$, respectively. In addition, multivalued input logic as shown in FIG. 4 can be incorporated. This logic has noninverting input terminals i1 to i5 and inverting input terminals $\overline{i1}$ to $\overline{i5}$.

Figure 5:
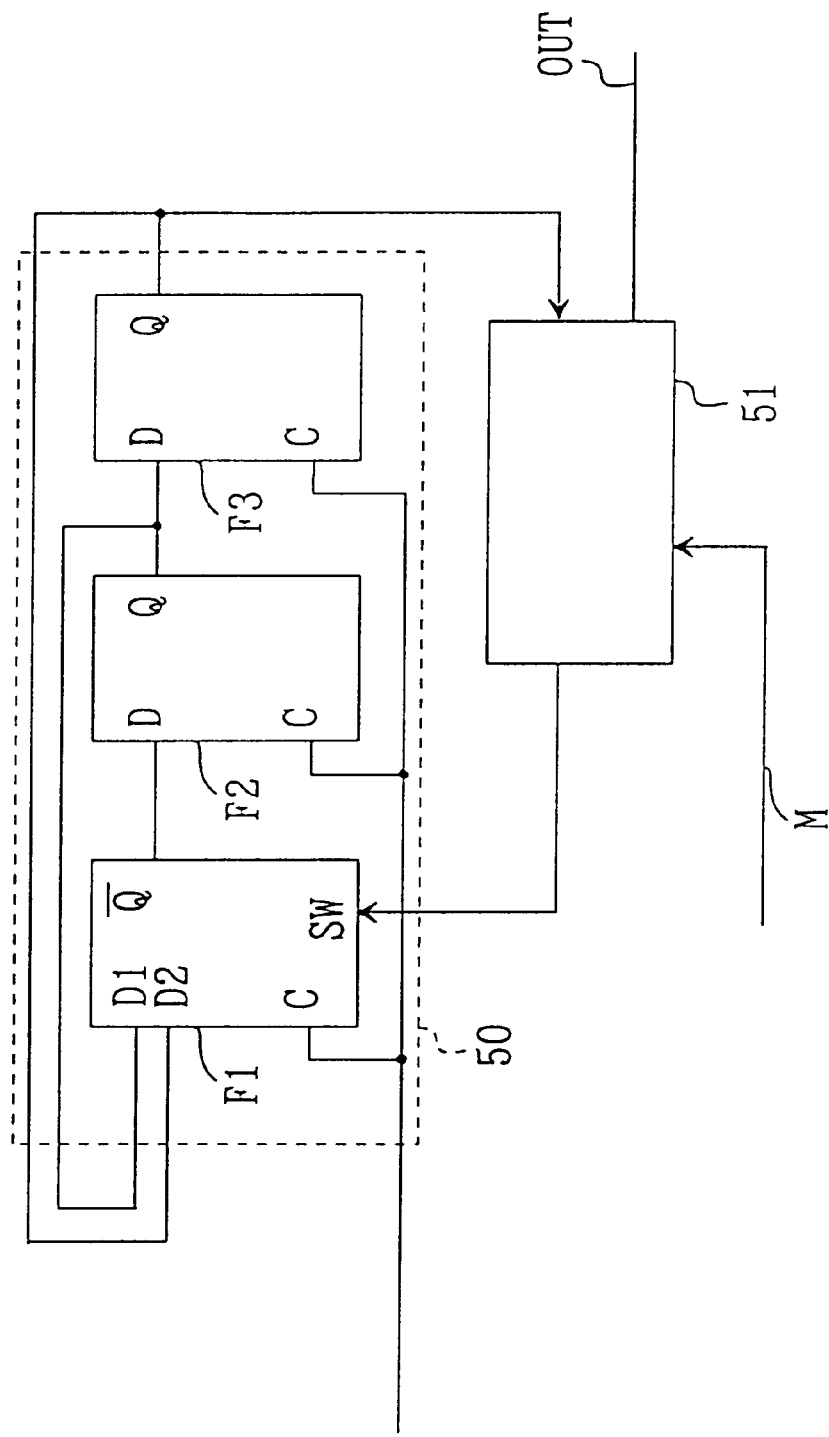
FIG. 5 is a circuit diagram of a further example of application of the first embodiment described above.

A dual modulus prescaler constructed using the frequency divider in accordance with the present embodiment is shown in FIG. 5, where the frequency divider in accordance with the present embodiment is represented as a frequency divider 50. For convenience, a modulus control circuit and a frequency division ratio extender are collectively designated a control circuit 51. The output from the third stage of D-type flip-flop F3 is applied to the control circuit 51. The frequency is divided by a frequency division ratio extender (not shown). The output is applied to a logic (not shown) for controlling the modulus. As mentioned previously, the input from the third stage of D-type flip-flop F3 applied to the terminal SW for switching the data applied to the first stage of D-type flip-flop F1 is allowed to be delayed by one clock pulse. The input can be applied to the terminal SW for switching the data applied to the first stage of D-type flip-flop F1 via the modulus controlling logic in this manner. The division ratio can be controlled according to the logic level at the terminal M as follows. For example, when the logic level at the terminal M is 0, logic level 0 is kept produced to the terminal SW, and the output from the second stage of D-type flip-flop F2 is accepted as its input. In this way, the frequency division with frequency division ratio of 4 is accomplished. If the logic level at the terminal M is 1, and if the logic portion for the modulus control is under proper conditions, the frequency division with frequency ratio of 4 is performed by setting the logic level at the terminal M to 1. According to the conditions, the frequency division with frequency division ratio of 4 and the frequency division with frequency division ratio of 5 can be combined at a given ratio to create a frequency division with frequency division ratio of 65. Where the terminal M assumes logic level of 0, a frequency division with frequency division ratio 6 may be attained by producing logic level 1 to the terminal SW and accepting the output from the third stage of D-type flip-flop F3 as its input.

In the first embodiment described above, the frequency divider achieves the frequency division with frequency division ratio of 5. Note that the present invention is not limited to this scheme. In a second embodiment given below, a frequency division with a division ratio greater than 5 is performed.

Figure 6:
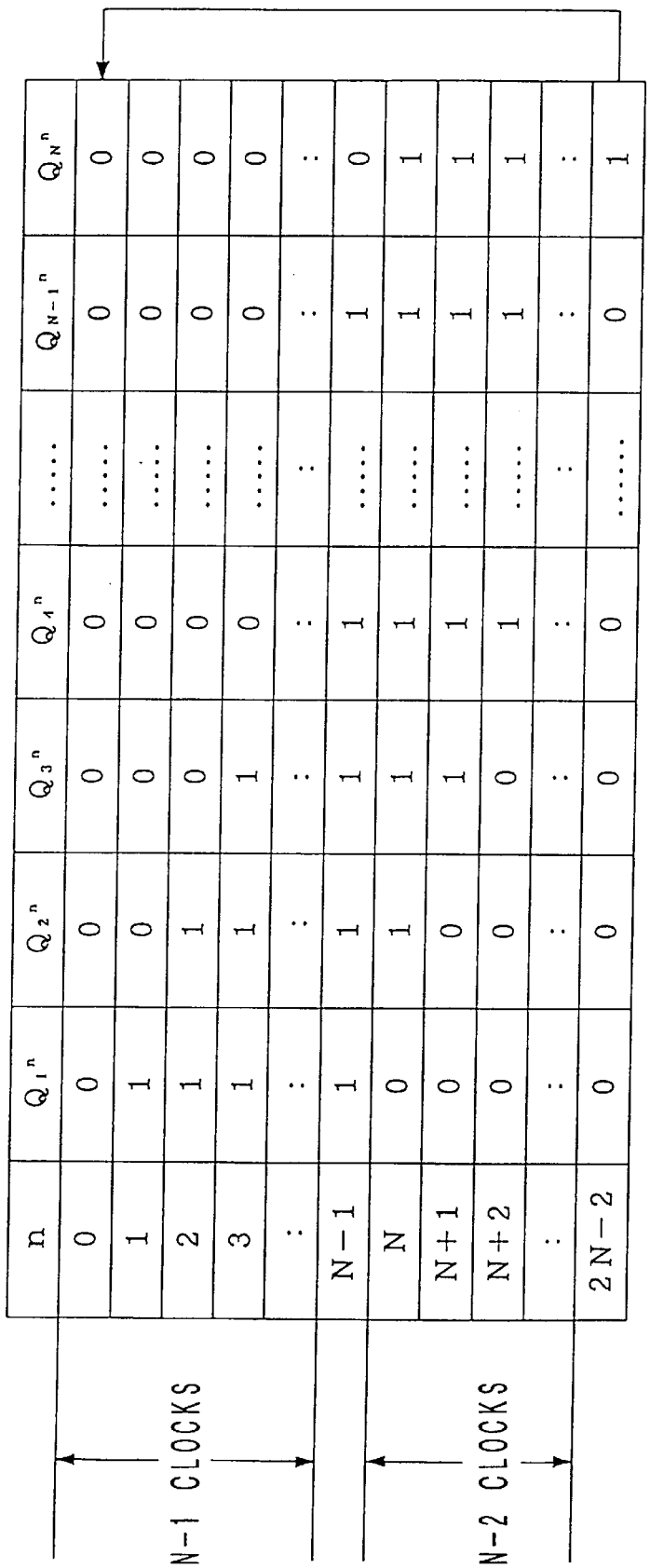
FIG. 6 is a table schematically illustrating the configuration of a frequency divider in accordance with a second embodiment of the invention.

N (three or greater integer) stages of D-type flip-flops are cascaded. The first stage of D-type flip-flop inverts the logic level of the input. Data is cyclically shifted according to the input clock signal to achieve a frequency division with ratio of (2N−1) of the clock signal. In this frequency divider, data in the D-type flip-flop is operated as shown in FIG. 6. In this figure, columns $Q_1{}^n$–$Q_N{}^n$ indicate the outputs from the first through Nth stages of D-type flip-flops in response to the nth clock pulse. Rows 0 to 2N–2 indicate 0th to (2N–2)th clock pulses, respectively.

Under the initial state (in response to the 0th clock pulse in FIG. 6), all the outputs of the D-type flip-flops take level 0. The output of the first stage of D-type flip-flop is shifted to 1 in response to the first clock pulse. In this way, the output is shifted in response to every clock pulse including the (N–1)th clock pulse from the first stage to the (N–1)th stage. Then, the output of the first stage of D-type flip-flop is shifted to 0 in response to the Nth clock pulse. The output is shifted in response to every clock pulse up to the Nth stage. The initial state is restored in response to the (2N–2)th clock pulse. These operations are repeated.

In the operations for shifting logic level 1 from the first stage to the (N–1)th stage, the output from the Nth stage takes on level 0. The inverted output from the (N–1)th stage of D-type flip-flop takes the same logic level as the output from the first stage of D-type flip-flop. During the subsequent operations for shifting the logic level 0 from the first stage to the Nth stage, the output from the Nth stage assumes logic level 1. The inverted output from the Nth stage of D-type flip-flop takes on the same logic level as the output from the first stage of D-type flip-flop in response to the next clock pulse.

If the output from the Nth stage of D-type flip-flop assumes logic level 0, the output from the (N–1)th D-type flip-flop is accepted as input to the first stage of D-type flip-flop. If the output from the Nth stage of D-type flip-flop takes level 1, the output from the Nth stage of D-type flip-flop is accepted as input to the first stage of D-type flip-flop. In this way, operations similar to the operations described above can be accomplished. The frequency division with frequency division ratio of (2N–1) can be performed. This frequency divider can be realized by using the D-type flip-flop F1 of the first embodiment as the first stage of D-type flip-flop. Except immediately before the logic level of the output from the Nth stage of D-type flip-flop is switched in response to the (N–1)th and (2N–2)th clock pulses, the output from the (N–1)th stage agrees with the output from the Nth stage of D-type flip-flop. Either output can be applied to the first stage of D-type flip-flop in response to the next clock pulse. Thus it will be understood that the output from the Nth stage of D-type flip-flop used in the first stage of D-type flip-flop to switch the input data is allowed to be delayed, in the same way as in the first embodiment described above. This delay permits the output from the Nth stage of D-type flip-flop to switch the input to the first stage of D-type flip-flop before the output from the (N–1)th stage of D-type flip-flop becomes different in logic level from the output from the Nth stage of D-type flip-flop. In particular, as shown in FIG. 6, when the logic level of the output from the Nth stage of D-type flip-flop changes from 1 to 0, delay corresponding to (N–1) clock pulses is permitted. When the logic level varies from 0 to 1, delay corresponding to (N–2) clock pulses is permitted. It substantially follows that delay corresponding to (N–2) clock pulses is tolerated.

Figure 7:
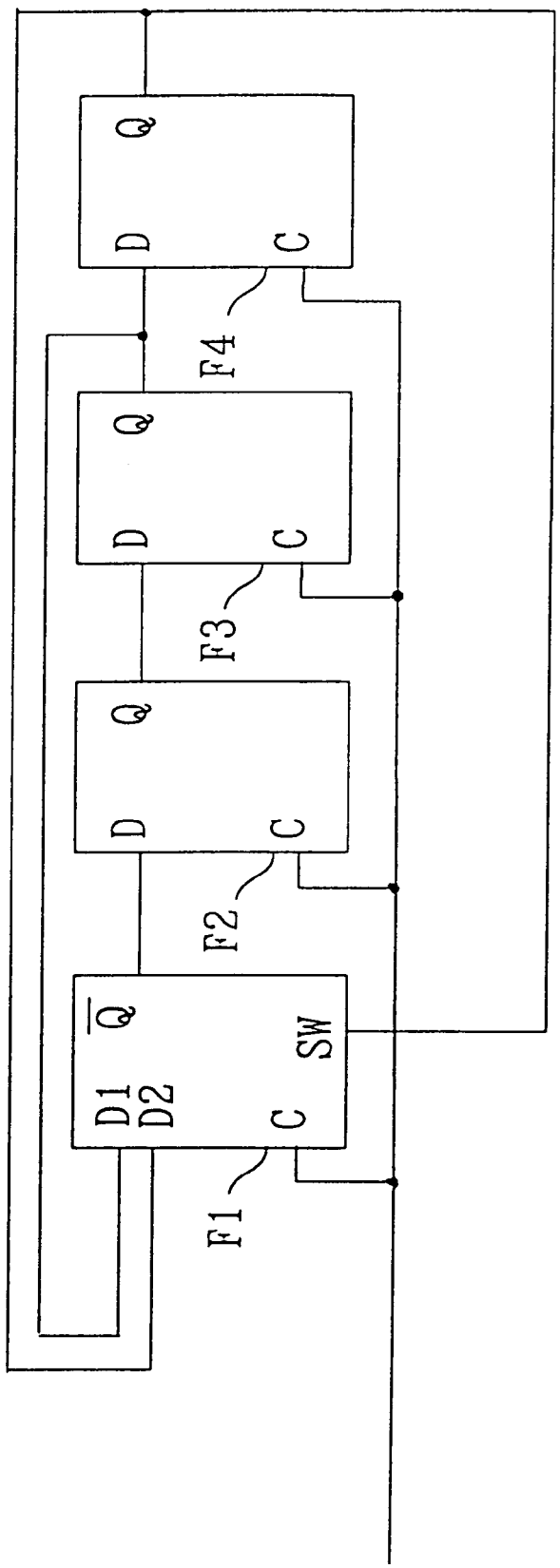
FIG. 7 is a circuit diagram of a frequency divider in accordance with the second embodiment described above.

A specific example of the present embodiment is shown in FIG. 7, where 4 stages of D-type flip-flops are used to achieve a frequency division with frequency division ratio of 7. The fourth stage of D-type flip-flop, F4, is similar in configuration to the second and third stages of D-type flip-flops F2 and F3, respectively. Let $Q_1^n$, $Q_2^n$, $Q_3^n$, and $Q_4^n$ be outputs from the D-type flip-flops F1–F4, respectively, in response to the nth clock pulse. The outputs from the D-type flip-flops F1–F4 shift the data cyclically in response to every clock pulse, achieving the frequency division with frequency division ratio of 7.

$(Q_1^{n-3}, Q_2^{n-3}, Q_3^{n-3}, Q_4^{n-3}) = (0, 0, 0, 0)$ $(Q_1^{n-2}, Q_2^{n-2}, Q_3^{n-2}, Q_4^{n-2}) = (1, 0, 0, 0)$ $Q_1^{n-2} = \overline{Q_2^{n-3}}(= \overline{Q_3^{n-3}})$ $(Q_1^{n-1}, Q_2^{n-1}, Q_3^{n-1}, Q_4^{n-1}) = (1, 1, 0, 0)$ $Q_1^{n-1} = \overline{Q_2^{n-2}}(= \overline{Q_3^{n-2}})$ $(Q_1^{n}, Q_2^{n}, Q_3^{n}, Q_4^{n}) = (1, 1, 1, 0)$ $Q_1^{n} = \overline{Q_2^{n-1}}(= \overline{Q_3^{n-1}})$ $(Q_1^{n+1}, Q_2^{n+1}, Q_3^{n+1}, Q_4^{n+1}) = (0, 1, 1, 1)$ $Q_1^{n+1} = \overline{Q_2^{n}}$ $(Q_1^{n+2}, Q_2^{n+2}, Q_3^{n+2}, Q_4^{n+2}) = (0, 0, 1, 1)$ $Q_1^{n+2} = \overline{Q_3^{n+1}}(= \overline{Q_2^{n+1}})$ $(Q_1^{n+3}, Q_2^{n+3}, Q_3^{n+3}, Q_4^{n+3}) = (0, 0, 0, 1)$ $Q_1^{n+3} = \overline{Q_3^{n+2}}(= \overline{Q_2^{n+2}})$ $(Q_1^{n+4}, Q_2^{n+4}, Q_3^{n+4}, Q_4^{n+4}) = (0, 0, 0, 0)$ $Q_1^{n+4} = \overline{Q_3^{n+3}} = Q_1^{n-3}$ The frequency divider in accordance with the present embodiment consists of many stages and provides large degree of division. This frequency divider yields the same advantages as the first embodiment described above. If the logic levels 1 and 0 of the data cycled as shown in FIG. 6 are all interchanged, it follows that the signals for switching the input data are interchanged in logic level. Specifically, when the output from the Nth stage of D-type flip-flop takes logic level 1, the output from the (N–1)th D-type flip-flop is accepted as input data. When the output assumes logic level 0, the output from the Nth D-type flip-flop is accepted as input data. This principle applies to every embodiment of the present invention.

A third embodiment of the present invention is next described. As described already in the first and second embodiments, in the present invention, no delay is present in the data transmission lines between the D-type flip-flops forming a frequency divider. The operating speed can be enhanced accordingly. Higher operating speed can be achieved by enhancing the operating speed of each D-type flip-flop. In the present embodiment, the operating speed of each D-type flip-flop itself is enhanced.

Figure 8:
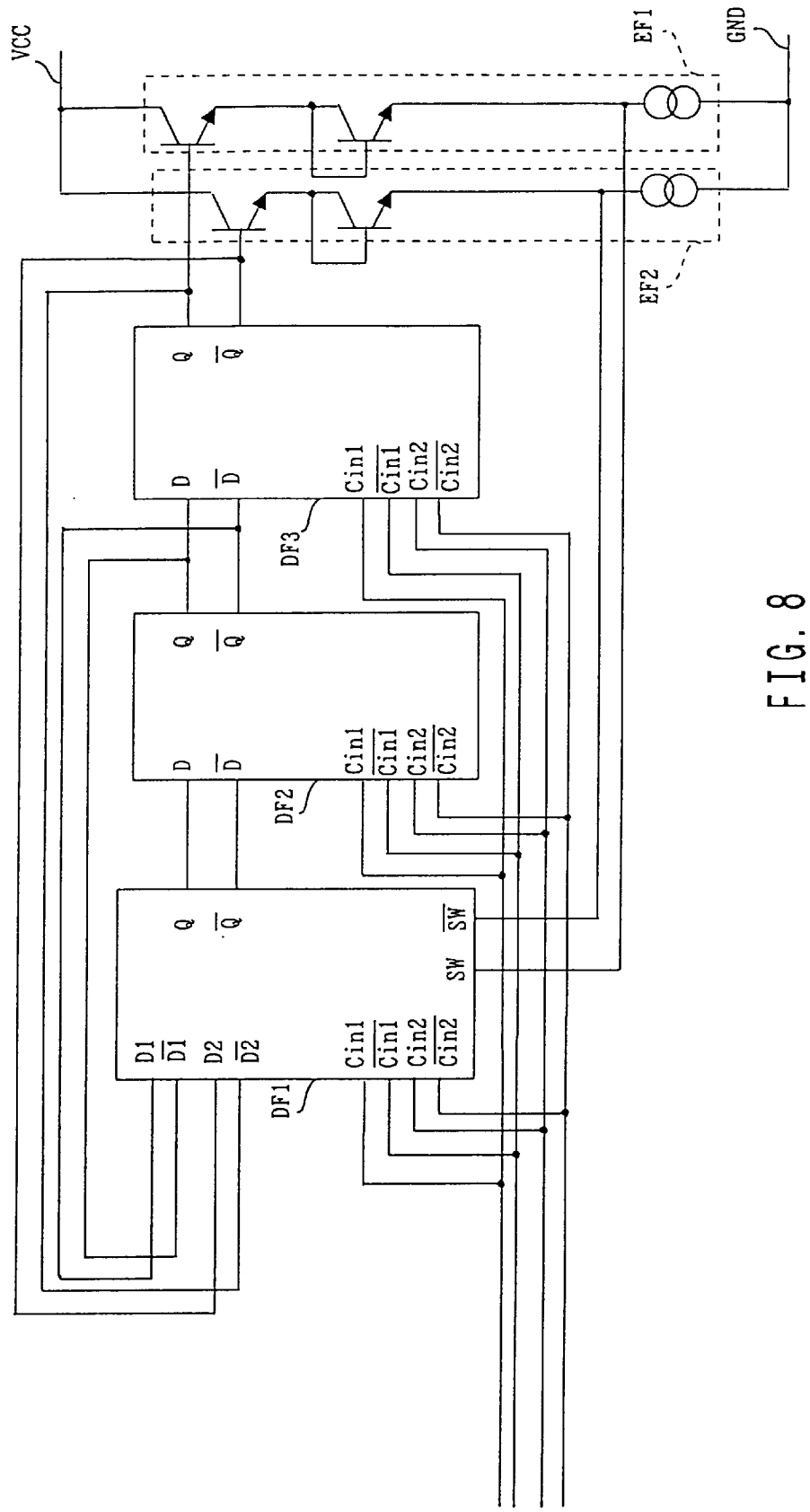
FIG. 8 is a circuit diagram of a frequency divider in accordance with a third embodiment of the invention.

FIG. 8 is a circuit diagram illustrating the configuration of the present embodiment. First through third stages of D-type flip-flops DF1–DF3 replace the flip-flops F1–F3, respectively, of the first embodiment. Data is shifted in a manner similar to the first embodiment. This third embodiment forms a frequency divider achieving the frequency division with frequency division ratio of 5. Also, in this embodiment, the first stage of D-type flip-flop DF1 has terminals D1, D2, $\overline{D1}$ and $\overline{D2}$ receiving the outputs from the second stage of D-type flip-flop DF2 and the outputs from the third stage of D-type flip-flop Df3, respectively. Further, the D-type flip-flop DF1 has terminals SW and $\overline{SW}$ receiving the outputs from the third stage of D-type flip-flop DF3. The D-type flip-flop DF1 selects either the outputs from the second stage of D-type flip-flop DF2 or the outputs from the third stage of D-type flip-flop DF3 according to the logic levels at the terminals SW and $\overline{SW}$.

In the present embodiment, the noninverting output and the inverting output from the D-type flip-flop DF3 are appropriately lowered in potential by an amount equal to twice the voltage developed across the base and emitter of the transistor via emitter followers EF1 and EF2, respectively. Then, the signals are applied to the terminals SW and $\overline{SW}$ of the D-type flip-flop DF1 This applies bias necessary to operate bipolar transistors (described later) receiving signals from the terminals SW and $\overline{SW}$.

The D-type flip-flops DF1–DF3 are of the master-slave type but different from the prior art device and from the embodiments described except for the following points.

In the D-type flip-flops DF1–DF3, electric current is supplied from a common current circuit to the input portions of the master and slave circuits in response to the first clock signal. Electric current is supplied from the common current circuit to their output portions in response to the second clock signal. This optimizes the timing at which data is written to the input portions and the timing at which data is held by the output portions. In consequence, the operating frequency is enhanced.

The D-type flip-flops DF1–DF3 have terminals Cin1 and Cin2 for accepting first and second clock signals, respectively, and clock terminals $\overline{\text{Cin1}}$ and $\overline{\text{Cin2}}$ for accepting the inverses of the first and second clock signals, respectively.

Figure 9:
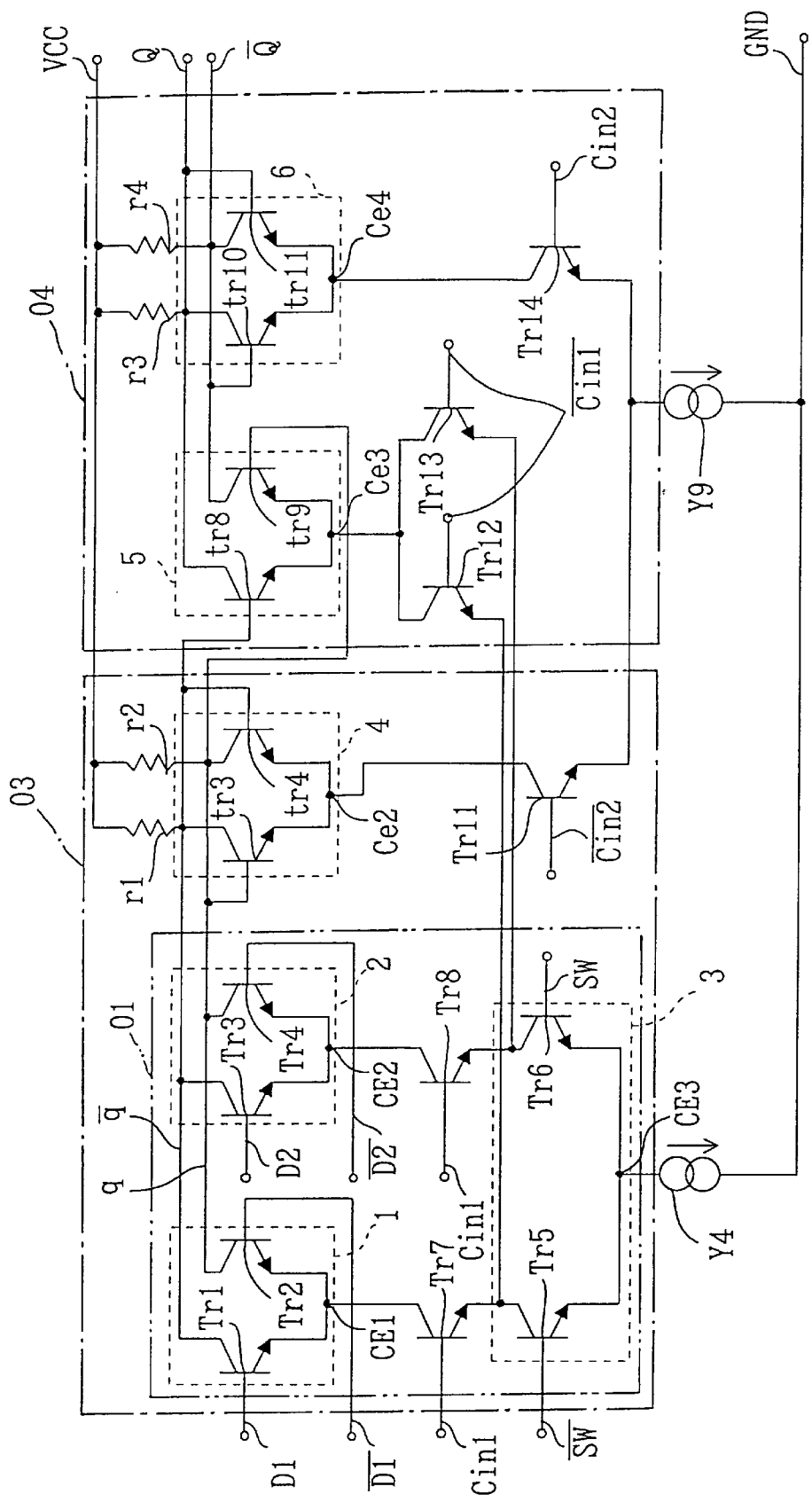
FIG. 9 is a circuit diagram of main portions of the frequency divider shown in FIG. 8.

The configuration of the first stage of D-type flip-flop DF1 is next described in detail. FIG. 9 is a circuit diagram illustrating the configuration of the D-type flip-flop DF1. This comprises a master circuit 03 and a slave circuit 04. The master circuit 03 has the input portion 01 and an output portion consisting of a fourth differential circuit 4 that is similar to the differential circuit Y3 in configuration. The slave circuit 04 has an input portion and an output portion. The input portion consists of a differential circuit 5 similar to the differential circuit Y7 in structure.

The output portion consists of a differential circuit 6 similar in structure with the differential circuit Y8. Transistors Tr7 and Tr8 controlling the supply of electric current to the input portion 01 of the master circuit 03 have their bases connected with the clock terminal Cin1. To control the supply of the electric current to the differential circuit 5 acting as the input portion of the slave circuit 04, a transistor Tr12 is connected between the emitter junction Ce3 of the differential circuit 5 and the collector of the transistor Tr5 of the differential circuit 3 in the master circuit 03, a transistor Tr13 is connected between the emitter junction Ce3 and the collector of the transistor Tr6 of the differential circuit 3, the bases of the transistors Tr12 and Tr13 are connected with the clock terminal $\overline{\text{Cin1}}$.

When the first clock signal goes to level 1, electric current is supplied from the constant-current circuit Y4 to the input portion 01 of the master circuit 03. When the first clock signal goes to level 0, electric current is supplied from the constant-current circuit Y4 to the differential circuit 5 serving as the input portion of the slave circuit 04. The differential circuits 4 and 6 acting as the output portion of the master circuit 03 and the output portion of the slave circuit 04, respectively, are connected with the constant-current circuit Y9 via transistors Tr11 and Tr14, respectively. The bases of the transistors Tr11 and Tr14 are connected with clock terminals $\overline{\text{Cin2}}$ and Cin2, respectively. When the second clock signal goes to 1, electric current is supplied from the constant-current circuit Y9 to the differential circuit 6 acting as the output portion of the slave circuit 04. The first clock signal is delayed by a given length with respect to the second clock signal. The load imposed when the data is inverted is reduced by ending the holding operation of the differential circuits 4 and 6 earlier and performing writing operation of the input portion 01 and the differential circuit 5. Furthermore, the inverting operation during writing and the writing operation are intensified by initiating the holding operation of the differential circuits 4 and 6 immediately before the end of the writing operation of the input portion 01 and the differential circuit 4. The delay time is established by the circuit components.

Figure 10:
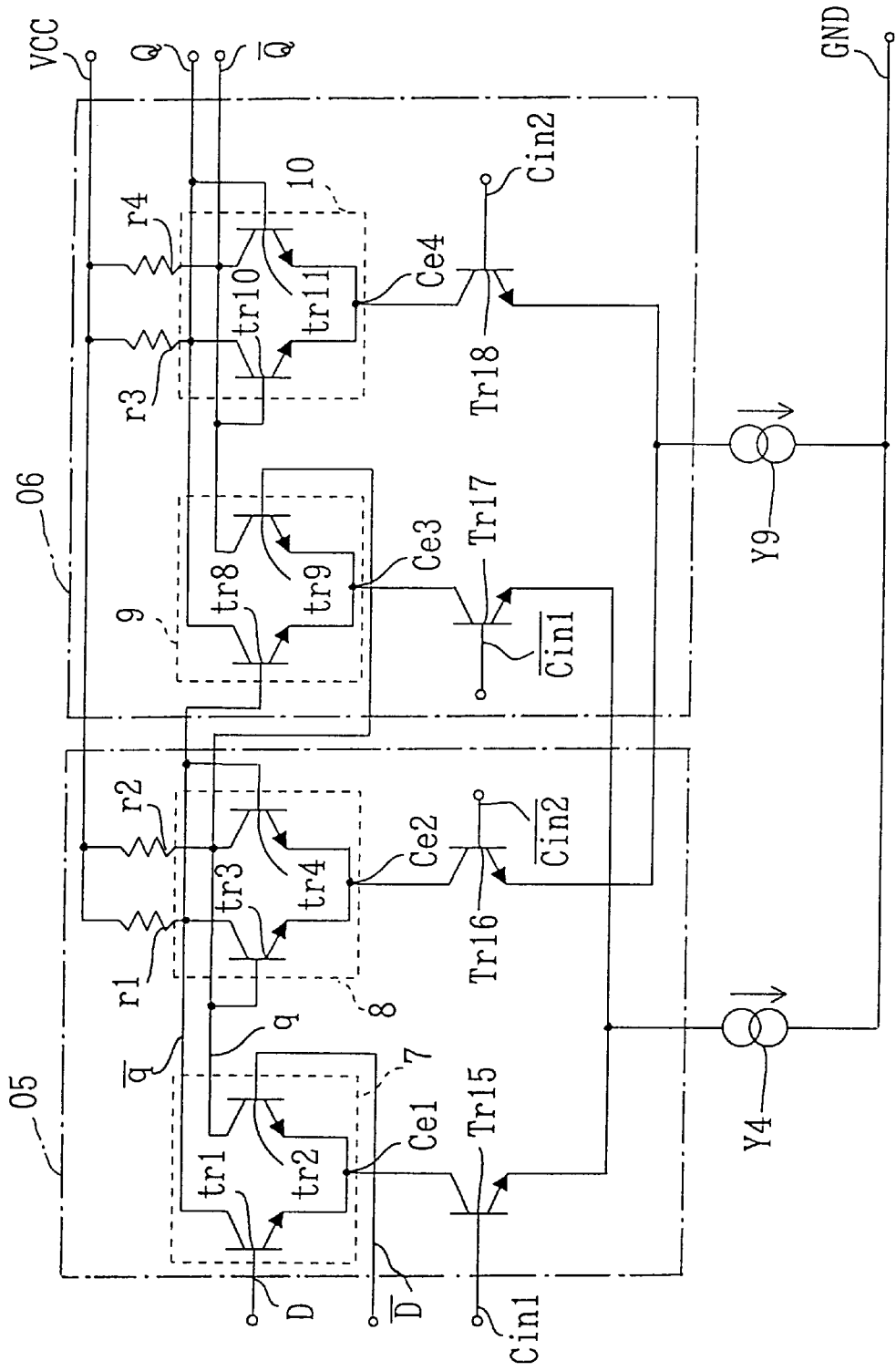
FIG. 10 is a circuit diagram of main portions of the frequency divider shown in FIG. 8.

The structures of the second and third stages of D-type flip-flops DF2, DF3, respectively, are described in detail. FIG. 10 is a circuit diagram showing the structure of the D-type flip-flop DF2 including a master circuit 05 and a slave circuit 06. The master circuit 05 comprises an input portion and an output portion. This input portion consists of a differential circuit 7 similar in structure with the differential circuit Y2. The output portion consists of a differential circuit 8 similar in structure with the differential circuit Y3. The slave circuit 06 comprises an input portion and an output portion. The input portion of the slave circuit 06 consists of a differential circuit 9 similar in structure with the differential circuit Y7. The output portion of the slave circuit 06 consists of a differential circuit 10 similar in structure with the differential circuit Y8. A transistor Tr15 controls the supply of electric current to the differential circuit 7 acting as the input portion of the master circuit 05. The base of the transistor Tr15 is connected with the terminal Cin1. A transistor Tr17 controls the supply of electric current to the differential circuit 9 serving as the input portion of the slave circuit. The base of the transistor Tr17 is connected with the clock terminal $\overline{\text{Cin1}}$. When the first clock signal goes to level 1, electric current is supplied from the constant-current circuit Y4 to the differential circuit 7 acting as the input portion of the master circuit 05. When the first clock signal goes to level 0, electric current is fed from the constant-current circuit Y4 to the differential circuit 9 acting as the input portion of the slave circuit 06. The differential circuit 8 acting as the output portion of the master circuit 05 and the differential circuit 10 acting as the output portion of the slave circuit 06 are connected with the constant-current circuit Y9 via transistors Tr16 and Tr18, respectively. The bases of these transistors Tr16 and Tr18 are connected with the clock terminals $\overline{\text{Cin2}}$ and Cin2, respectively. When the second clock signal goes to level 1, electric current is supplied from the constant-current circuit Y9 to the differential circuit 10 acting as the output portion of the slave circuit 06. When the second clock signal goes to level 0, electric current is supplied from the constant-current circuit Y9 to the differential circuit 8 acting as the output portion of the master circuit 05.

The operation of the D-type flip-flops DF1 and DF2 shown in FIGS. 9 and 10, respectively, is described now. The input portion 01 of the D-type flip-flop DF1 performs an operation for switching the input data in the same way as the operation described in the first embodiment. Therefore, this operation for switching the input data is not described in detail below. The manner in which data is transferred between the input portion and the output portion of each of the master circuit 03 and the slave circuit 04 is described. For convenience, it is assumed that the D-type flip-flops DF1 and DF2 constitute a ½ frequency divider for performing a frequency division with frequency division ratio of 2. The terminals and SW of the D-type flip-flop. DF1 are set to levels 1 and 0, respectively, to make effective only the data input to the input terminals D1 and $\overline{\text{D1}}$. Consequently, the D-type flip-flops DF1 and DF2 can be regarded as having the same structure. In particular, in the D-type flip-flop DF1, the differential circuits 1 and 5 correspond to the differential circuits 7 and 9 of the D-type flip-flop DF2. The differential circuits 4 and 6 correspond to the differential circuits 8 and 10 of the D-type flip-flop DF2. The transistors Tr7 and Tr12 correspond to the transistors Tr15 and Tr17, respectively, of the D-type flip-flop DF2. Transistors Tr11 and Tr14 correspond to the transistors Tr16 and Tr18 of the D-type flip-flop DF2. If the data input to the input terminals D2 and $\overline{\text{D2}}$ are made effective by setting the terminals $\overline{\text{SW}}$ and SW of the D flip-flop DF1 to 0 and 1, respectively, then the differential circuit 2 corresponds to the differential circuit 8 of the D-type flip-flop DF2 instead of the differential circuit 1. The transistor Tr8 corresponds to the transistor Tr15 of the D-type flip-flop DF2 instead of the transistor Tr7. The transistor Tr13 corresponds to the transistor Tr17 of the D-type flip-flop DF2 instead of the transistor Tr12. In the D-type flip-flop DF1, a ½ frequency divider can be constructed by connecting the terminals D1 and $\overline{D1}$ with the output terminals $\overline{Q}$ and Q. respectively. In the D-type flip-flop DF2, a ½ frequency divider can be built by connecting the input terminals D and $\overline{D}$ with the output terminals $\overline{Q}$ and Q. respectively.

Figure 11:
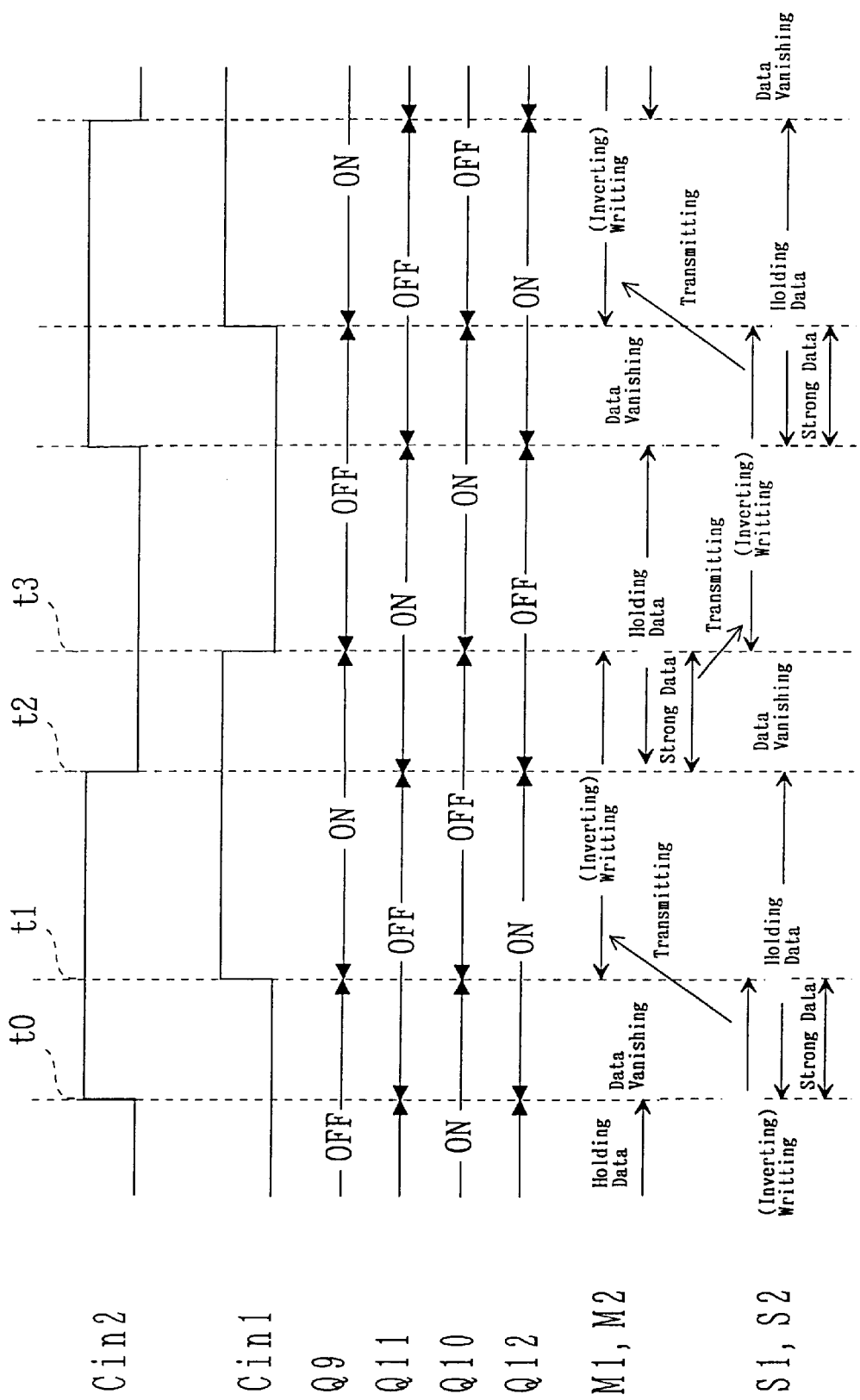
FIG. 11 is a timing chart illustrating the operation of the frequency divider shown in FIG. 8.

The operation of the ½ frequency divider constructed by the D-type flip-flop DF2 shown in FIG. 10 is described by referring to the flowchart of FIG. 11. In FIG. 11, Cin1 and Cin2 indicate the first and second clock signals, respectively, at the clock terminals Cin1 and Cin2. Tr15, Tr16, Tr17, and Tr18 indicate whether the transistors Tr15, Tr16, TR17, and Tr18 are conducting (ON) or cut off (OFF). Whether data are being written or held at the terminals q, $\overline{q}$ of the master circuit 05 and at the output terminals Q and $\overline{Q}$ of the slave circuit 06 are indicated by q, $\overline{q}$, Q and $\overline{Q}$, respectively. The D-type flip-flop DF1 operates similarly. In FIG. 11, the operation at each terminal of the D-type flip-flop DF1 corresponding to each terminal of the D-type flip-flop DF2 is also written and put in parentheses, illustrating the state of each terminal.

At the first timing t0, if the second clocksignal goes to level 1, the transistors Tr16 and Tr18 are turned off and on, respectively. This stops the supply of electric current from the constant-current circuit Y9 to the differential circuit 8. Data items held in the terminals $\overline{q}$ and q tend toward disappearance. As the transistor Tr18 is turned on, supply of electric current from the constant-current circuit Y9 to the differential circuit 10 is started. An operation for holding data at the terminals Q and $\overline{Q}$ is initiated.

At the next timing t1, if the first clock signal goes to level 1, the transistors Tr15 and Tr17 are turned on and off, respectively. This starts supply of electric current from the constant-current circuit Y4 to the differential circuit 7 and, at the same time, stops the supply of electric current from the constant-current circuit Y4 to the differential circuit 9. Data at the terminals Q and $\overline{Q}$ of the slave circuit 06 have been transmitted to the differential circuit 7. An operation for writing these data to the terminals $\overline{q}$ and q is started. For example, if data items "1" and "0" are held at the terminals q and $\overline{q}$, data items are received from the terminals Q and $\overline{Q}$ and inverted. Since the data items "1" and "0" at the terminals q and $\overline{q}$ are decreasing toward disappearance from the timing t0, the load imposed on the inversion operation at the timing t1 is small. That is, a fast writing operation is permitted. The writing operation of the differential circuit 9 is stopped simultaneously with start of the writing of the differential circuit 7.

At the next timing t2, if the second clock signal goes to level 0, the transistors Tr16 and Tr18 are turned on and off, respectively, thus starting supply of electric current from the constant-current circuit Y9 to the differential circuit 8. At the same time, the supply of electric current to the differential circuit 10 is stopped. The differential circuit 8 starts an operation for holding data. Since the writing operation by the differential circuit 7 cooperates with the holding operation, data items are strongly written into the terminals $\overline{q}$ and q. In other words, the same data items are doubly written. If the supply of electric current to the differential circuit 10 stops, the data-holding operation of the differential circuit 10 stops. The data items held at the terminals Q and $\overline{Q}$ tend toward disappearance.

At the next timing t3, if the first clock signal goes to level 0, the transistors Tr15 and Tr17 are turned off and on, respectively. The data-writing operation of the differential circuit 7 stops. Concurrently, the data-writing operation of the differential circuit 9 starts. The data items held at the terminals and $\overline{q}$ of the master circuit 05 are transmitted to the differential circuit 9. These data items are doubly written at the instants t2 and t3 and so they are transmitted well. Similarly, data is transmitted well from the slave circuit 06 to the master circuit 05 at the previous timing t1. Since the data items held at the terminals Q and $\overline{Q}$ are decreasing toward disappearance from the timing t2, the data items transmitted well are quickly written. Subsequently, a series of operations performed at the instants t0–t3 are repeatedly carried out.

As described thus far, in both master circuit 05 and slave circuit 06, old data disappear before new data are written. The transmitting side doubly writes the same data. Therefore, writing operation can be performed reliably. These two actions permit good data transmission that has been impossible to achieve by the prior art circuit. Good output waveforms are obtained. Furthermore, operation at higher operating frequencies is possible.

Figure 12:
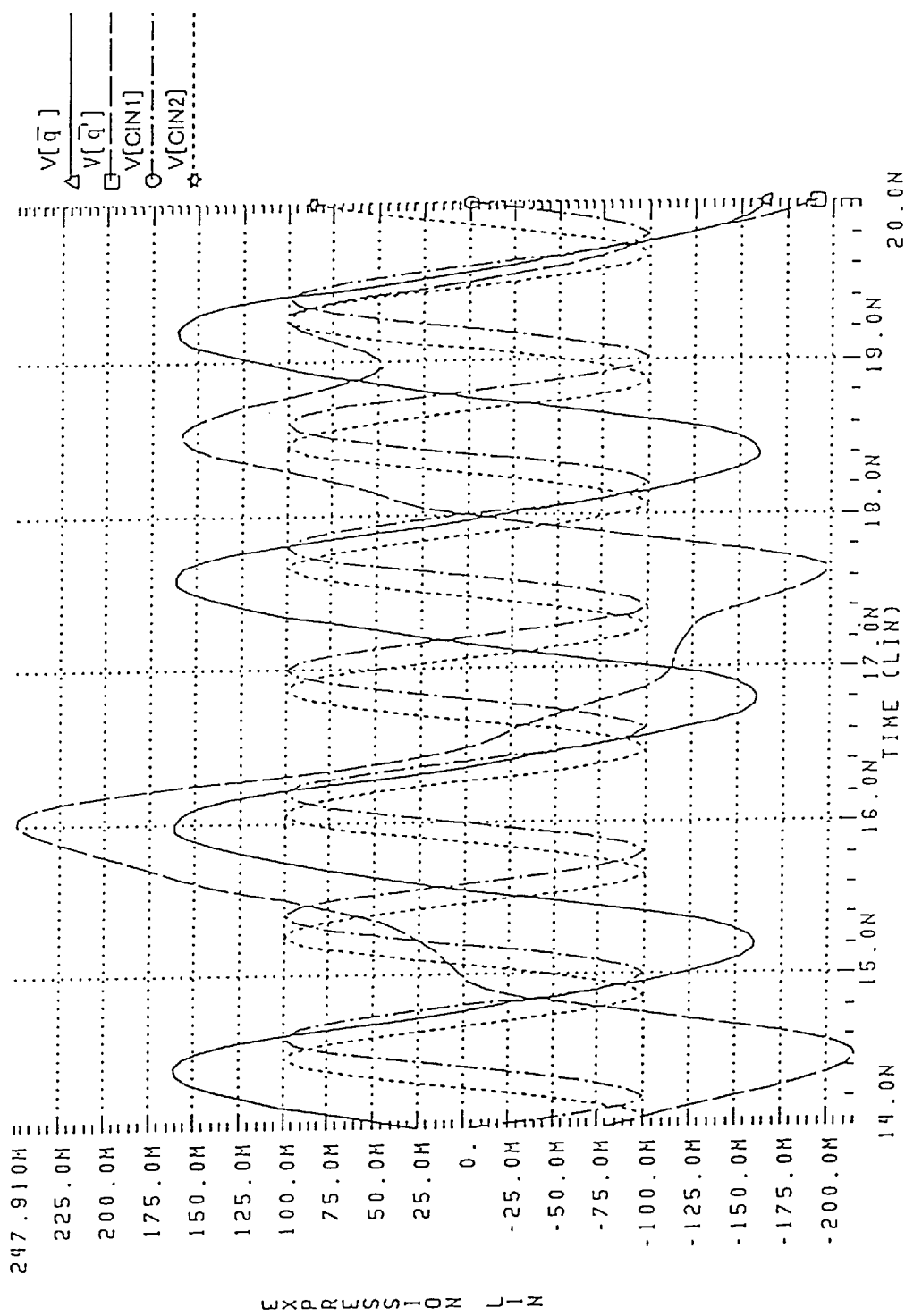
FIG. 12 is a waveform chart illustrating the operation of the frequency divider shown in FIG. 8.
Figure 13:
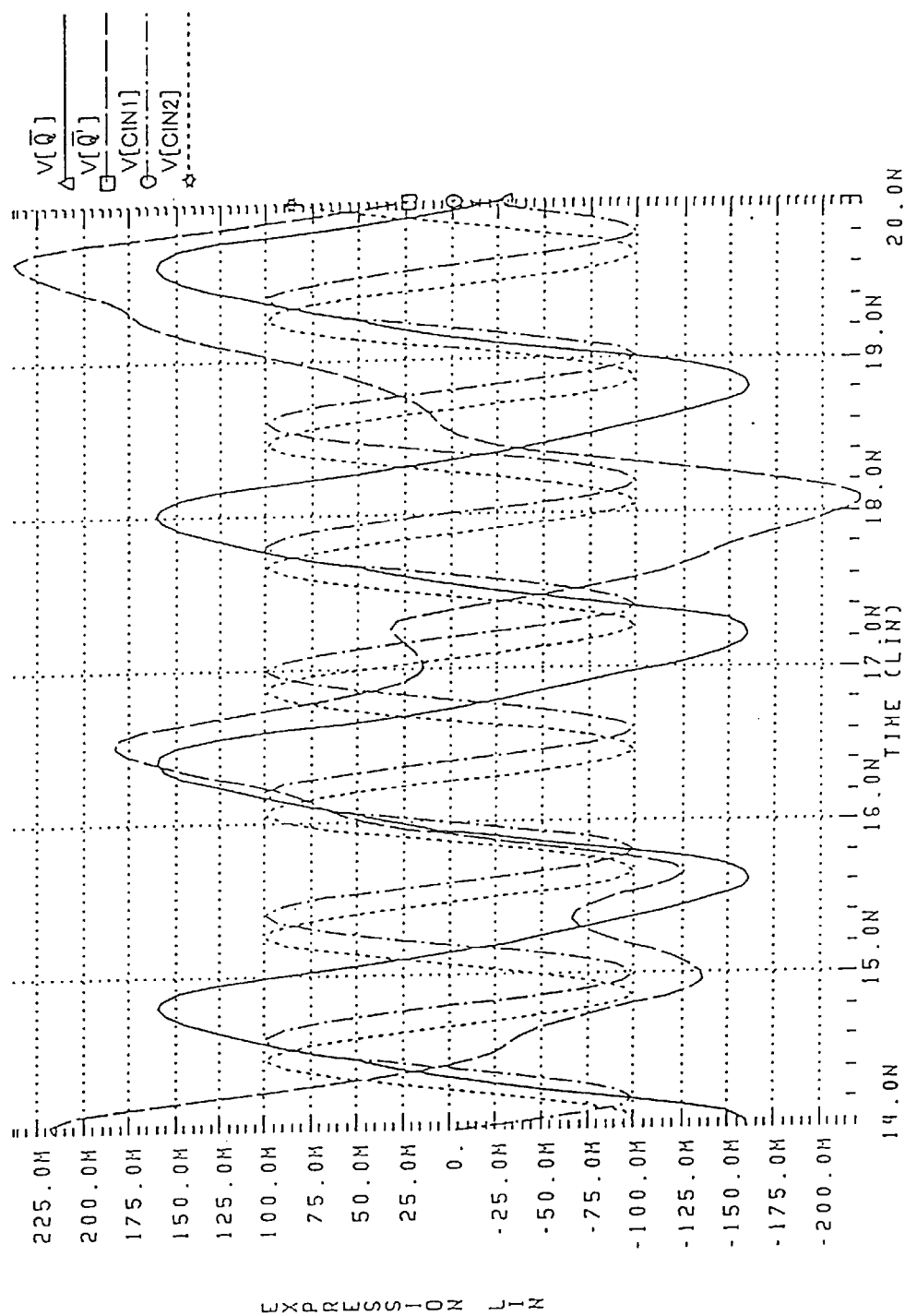
FIG. 13 is another waveform chart illustrating the operation of the frequency divider shown in FIG. 8.

Results of a simulation made on a ½ frequency divider constructed from the D-type flip-flop DF2 are given below. For comparison, a simulation was made on a ½ frequency divider using the D-type flip-flop F2 of the same construction as the prior art structure. The input terminals D and $\overline{D}$ of the D-type flip-flop F2 were connected with the output terminals $\overline{Q}$ and Q, respectively, and a ½ frequency divider was built. The first clock signal and the inverse of this first clock signal were applied to the clock terminals C and $\overline{C}$, respectively. In brief, the characteristics and the circuit constants of transistors forming the ½ frequency divider in FIGS. 12 and 13 were set to appropriate values. The ½ frequency divider was operated at a clock speed of 1.25 GHz. In the following waveform diagrams, the characteristics and circuit constants of transistors are the same as those of FIGS. 12 and 13 unless otherwise specifically stated. If the characteristics and circuit constants of the transistors of FIGS. 12 and 13 are modified, the tendency appearing at the following waveform diagrams hardly varies. In FIG. 12, V[$\overline{q}$] underlined with a solid line indicates the amplitude of the voltage at the terminal $\overline{q}$. V[CIN1] underlined with a dot-and-dash line indicates the first clock signal. V[CIN2] underlined with a broken line indicates the second clock signal. V[$\overline{q'}$] underlined with a broken line indicates the amplitude of the voltage at the terminal $\overline{q'}$ of the D-type flip-flop F2. In the following waveform diagrams, like reference numerals and symbols denote like components.

In FIG. 13, V[$\overline{Q}$] underlined with a solid line indicates the amplitude of the voltage at the terminal $\overline{Q}$ of the D-type flip-flop DF2. V[$\overline{Q'}$] underlined with a broken line indicates the amplitude of the voltage at the terminal $\overline{Q'}$ of the D-type flip-flop F2. It can be seen from the results of the simulations given in FIGS. 12 and 13 that the frequency divider in accordance with the present embodiment can sufficiently respond to a clock speed that frequency divider in accordance with the first embodiment cannot follow. In particular, as indicated by V[$\overline{q}$] underlined with a solid line and by V[$\overline{Q}$] underlined with a solid line in FIG. 12, undistorted waveforms are obtained in the present embodiment. In contrast, as indicated by V[$\overline{q'}$] underlined with a broken line in FIG. 12 and by V[$\overline{Q'}$] underlined with a broken line in FIG. 13, distorted waveforms are produced in the first embodiment, resulting in malfunctions.

Figure 14:
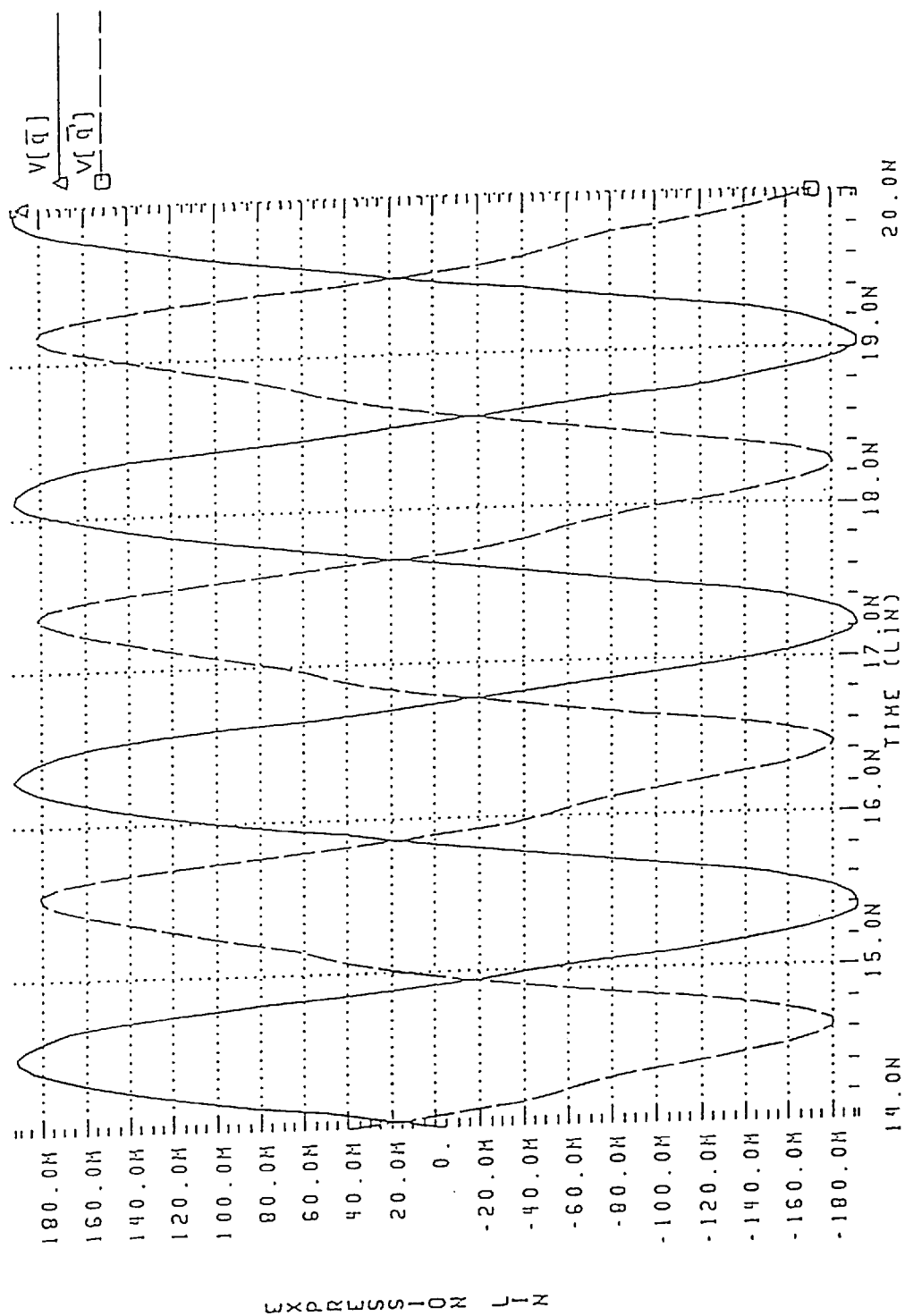
FIG. 14 is a further waveform chart illustrating the operation of the frequency divider shown in FIG. 8.

FIG. 14 illustrates the results of a simulation performed at a clock speed of 1.1 GHz. This figure compares cases where the frequency divider follows the clock speed, as well as the frequency divider in accordance with the first embodiment. The results of simulation shown in FIG. 14 indicate that the present embodiment produces less distorted waveform output.

Figure 15:
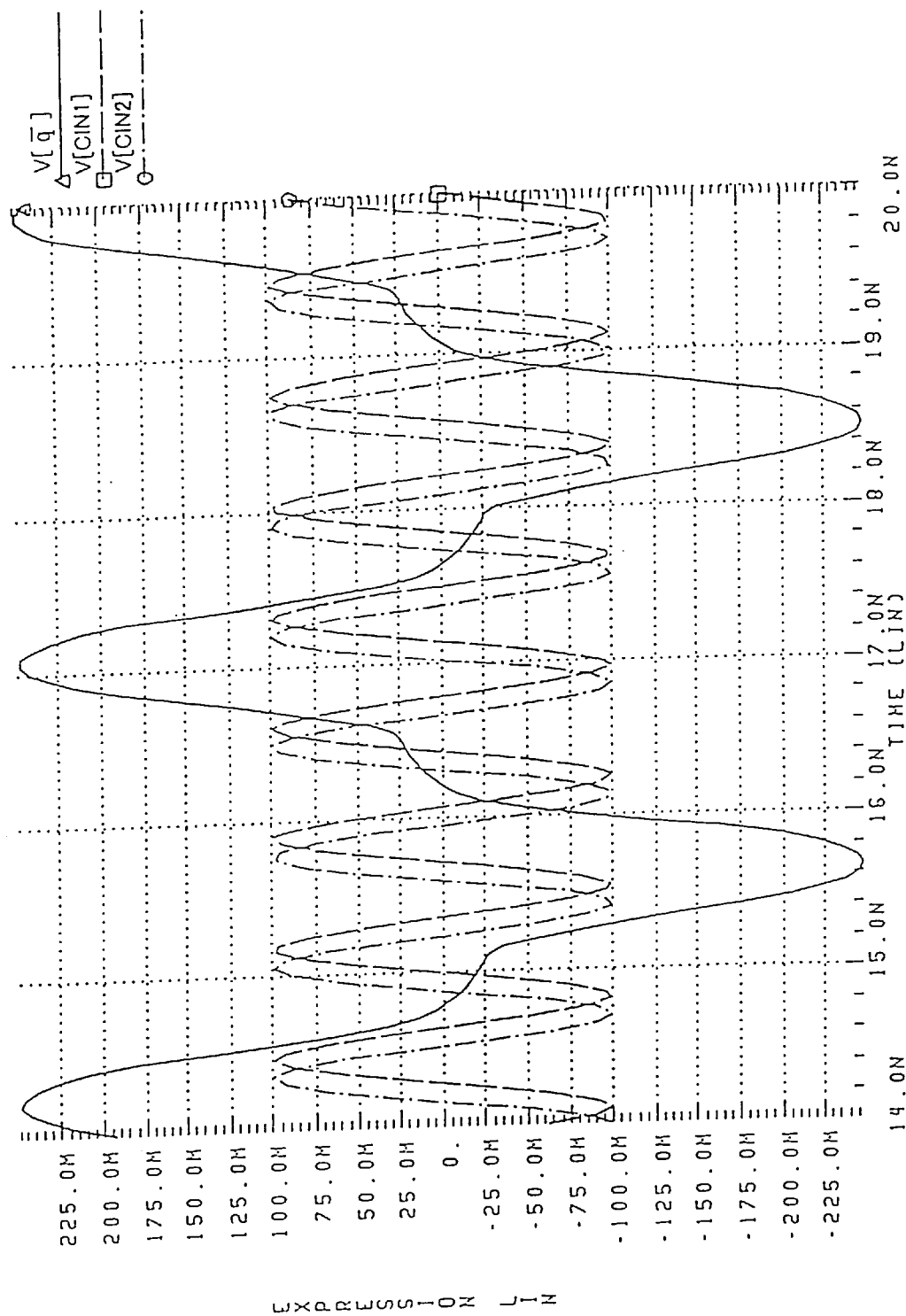
FIG. 15 is a still other waveform chart illustrating the operation of the frequency divider shown in FIG. 8.

FIG. 15 illustrates the results of a simulation performed at a clock speed of 1.4 GHz. It can be seen that a circuit in accordance with the present embodiment cannot follow the clock speed.

Figure 16:
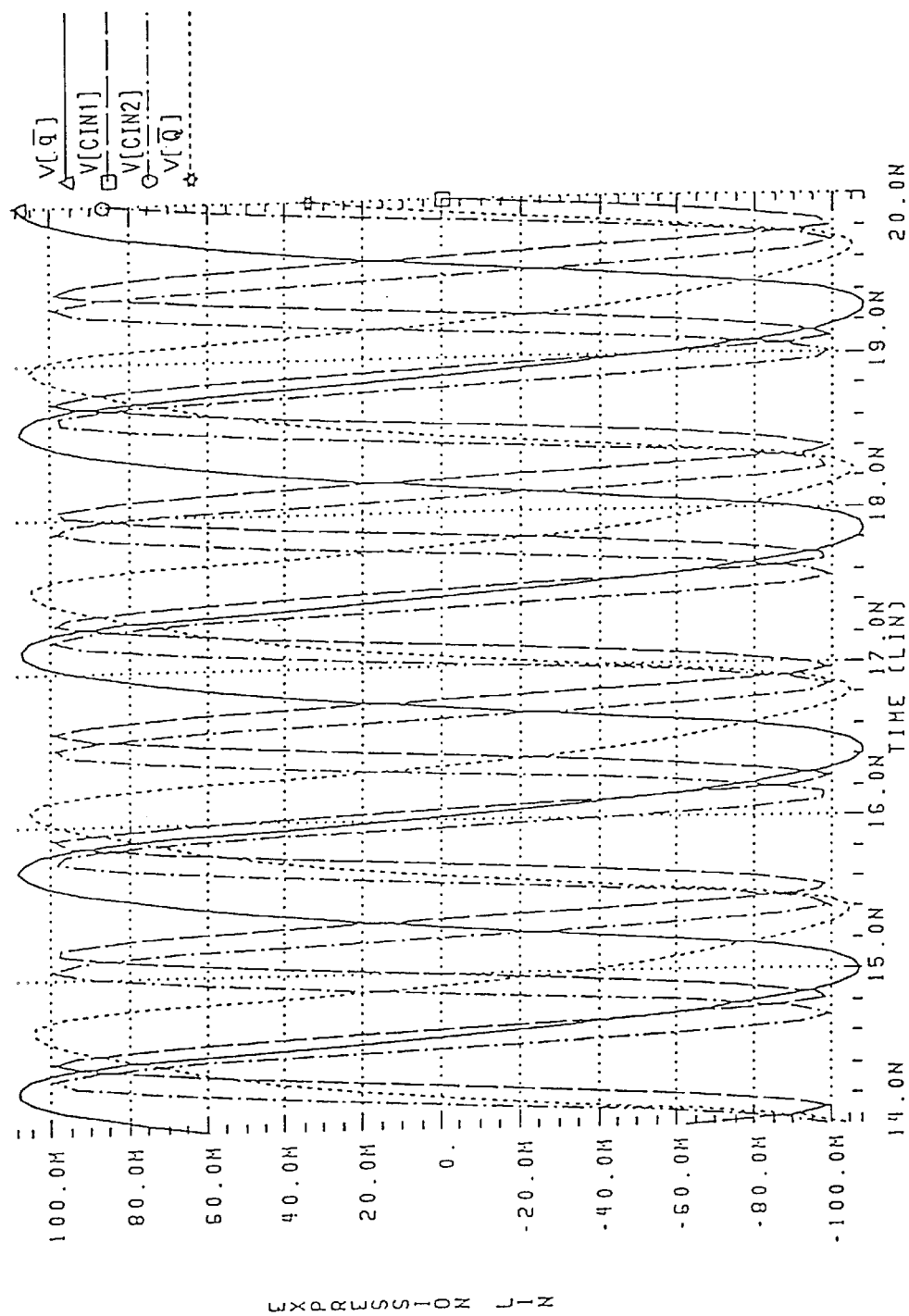
FIG. 16 is a yet other waveform chart illustrating the operation of the frequency divider shown in FIG. 8.

In the simulations described above, the constant-current circuit Y4 and Y9 supply the same amount of current 50 $\mu$ A to their respective differential circuits. The amount of current supplied by the constant-current circuit Y4 was set to 50 A. The amount of current supplied by the constant-current circuit Y9 was set to 30 $\mu$A. The clock speed was set to 1.4 GHz. Under these conditions, simulations were made. The results are shown in FIG. 16. It can be seen that the frequency divider can be operated even at the clock speed of 1.4 GHz.

Figure 17:
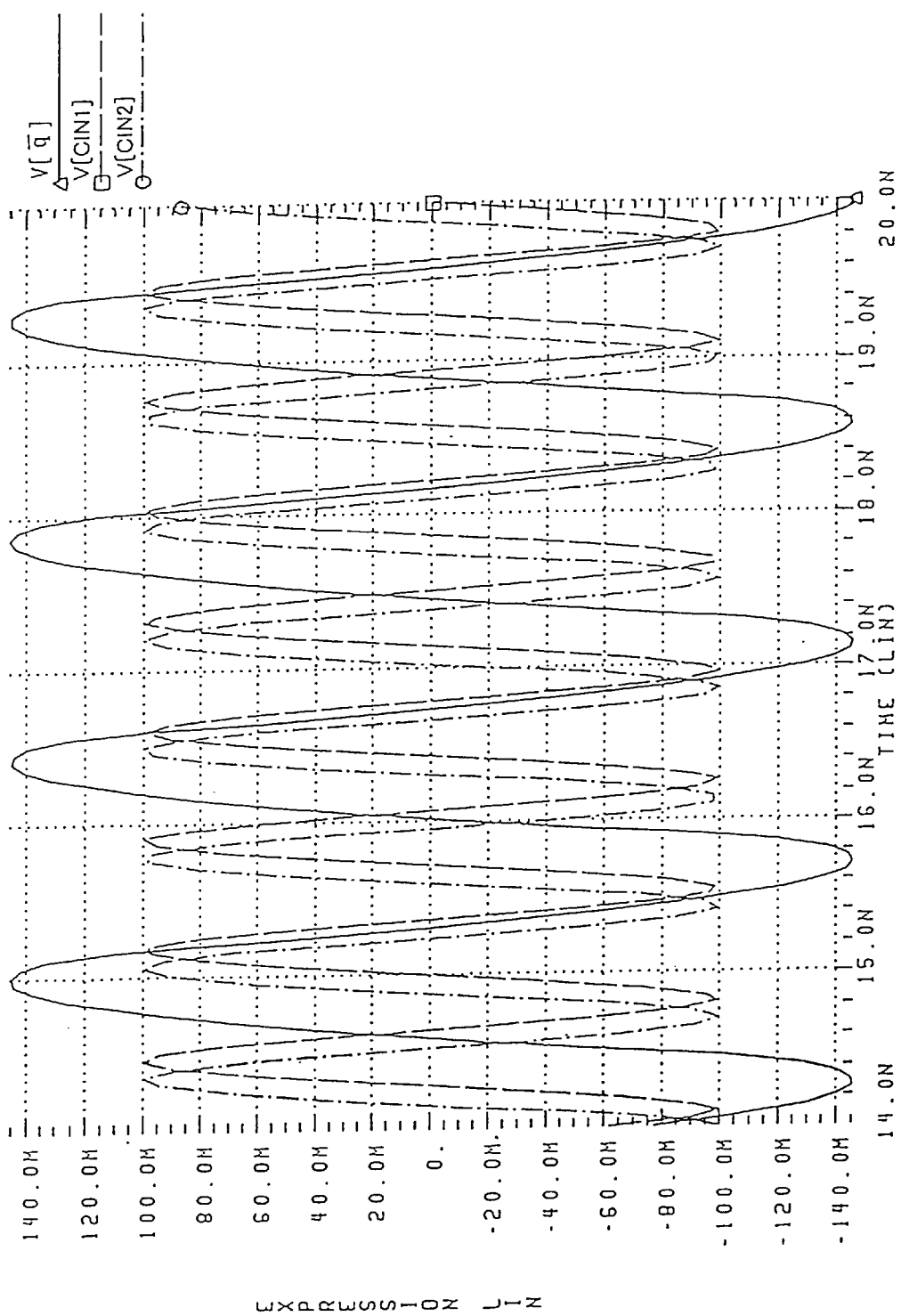
FIG. 17 is a yet other waveform chart illustrating the operation of the frequency divider shown in FIG. 8.

In the present embodiment, the amounts of currents supplied by the constant-current circuits Y4 and Y9 are not always required to be identical. Where data are held without involving inversion operation such as writing of data, a small amount of current sufficient to prevent the data from being lost will suffice. Therefore, the amount of current supplied by the constant-current circuit Y9 can be made less than the amount of current supplied by the constant-current circuit Y4. In consequence, the operating speed can be enhanced. Furthermore, the amount of current consumed can be reduced. In the case of FIG. 16, the amount of current can be reduced by 20%. A simulation was made in which the amount of current supplied by the constant-current circuit Y4 was set larger than the amount of current supplied by the second constant-current circuit without changing the total amount of current consumed. The results are shown in FIG. 17. It can be seen that the frequency divider can operate even at a clock speed of 1.4 GHz. This divider has the advantage that it can generate voltages of greater amplitudes than the frequency divider designed to consume a less amount of current. In the simulation given in FIG. 17, the amounts of current supplied by the constant-current circuit Y4 and the second current supply circuit were set to 60 $\mu$A and 40 $\mu$A, respectively.

As described thus far, in the present embodiment, the amount of current supplied from the constant-current circuit Y9 to the corresponding differential circuit is set less than the amount of current supplied from the constant-current circuit Y4 to the corresponding differential circuit. Therefore, the operating frequency can be enhanced. Furthermore, the amount of current consumed can be curtailed. Under the simulation conditions described above, the amount of phase delay that the first clock signal is delayed with respect to the second clock signal can be set to 40–120 degrees, preferably 60–90 degrees.

As described thus far, in the present invention, no gate delay exists in transmitting data between D-type flip-flops forming a frequency divider. Therefore, full use of the high-speedcapability of D-type flip-flops such as the D-type flip-flops DF1–DF3 given in the present embodiment can be made. In other words, a frequency divider operating at a higher operating frequency can be realized by constructing it from high-speed D-type flip-flops such as the D-type flip-flops DF1–DF3. The signals applied from the third stage of D-type flip-flop DF3 to the terminals SW and $\overline{SW}$ are allowed to be delayed. This permits the timing at which these signals are applied to be delayed. During high-speed operation, malfunctions are reduced. This contributes to higher-speed operation.

Figure 18:
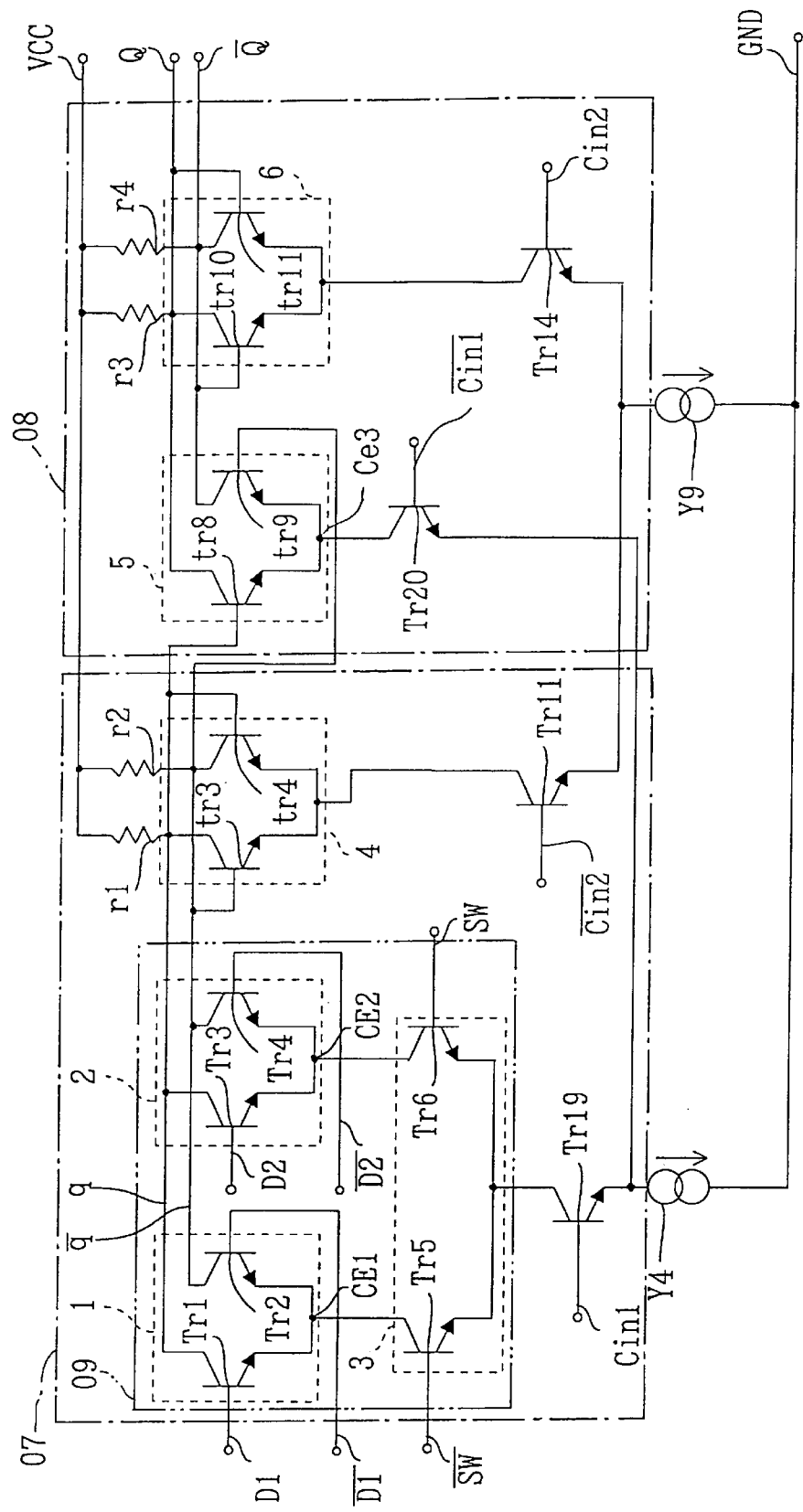
FIGS. 18–22 are circuit diagrams of frequency dividers in accordance with other embodiments of the invention.

In the embodiments described above, the transistors for controlling the switching of the input data are placed closer to the constant-current circuits than the transistors for controlling the transfer of data between the input and output portions of the first stage of D-type flip-flop. Conversely, the transistors for controlling the transfer of data may be placed closer to the constant-current circuits than the transistors for switching the input data. For instance, if a D-type flip-flop corresponds to the D-type flip-flop DF1, it can be modified as shown in FIG. 18. The D-type flip-flop comprises a master circuit 07 and a slave circuit 08. The master circuit 07 has an input portion 09 in which transistors Tr5 and Tr6 are connected with emitter junctions CE1 and CE2, respectively. Differential circuits 1 and 2 are directly connected with a differential circuit 3. This differential circuit 3 is connected with a constant-current circuit Y4 via a transistor Tr19 having a base receiving a first clock signal. The slave circuit 08 has an input portion consisting of a differential circuit 5. In this differential circuit 5, an emitter junction Ce3 is connected with a transistor Tr20 having a base receiving the inverse of the first clock signal. The emitter junction Ce3 is connected with the constant-current circuit Y4 via this transistor Tr20. This D-type flip-flop yields advantages similar to those produced by the D-type flip-flops described above.

Figure 19:
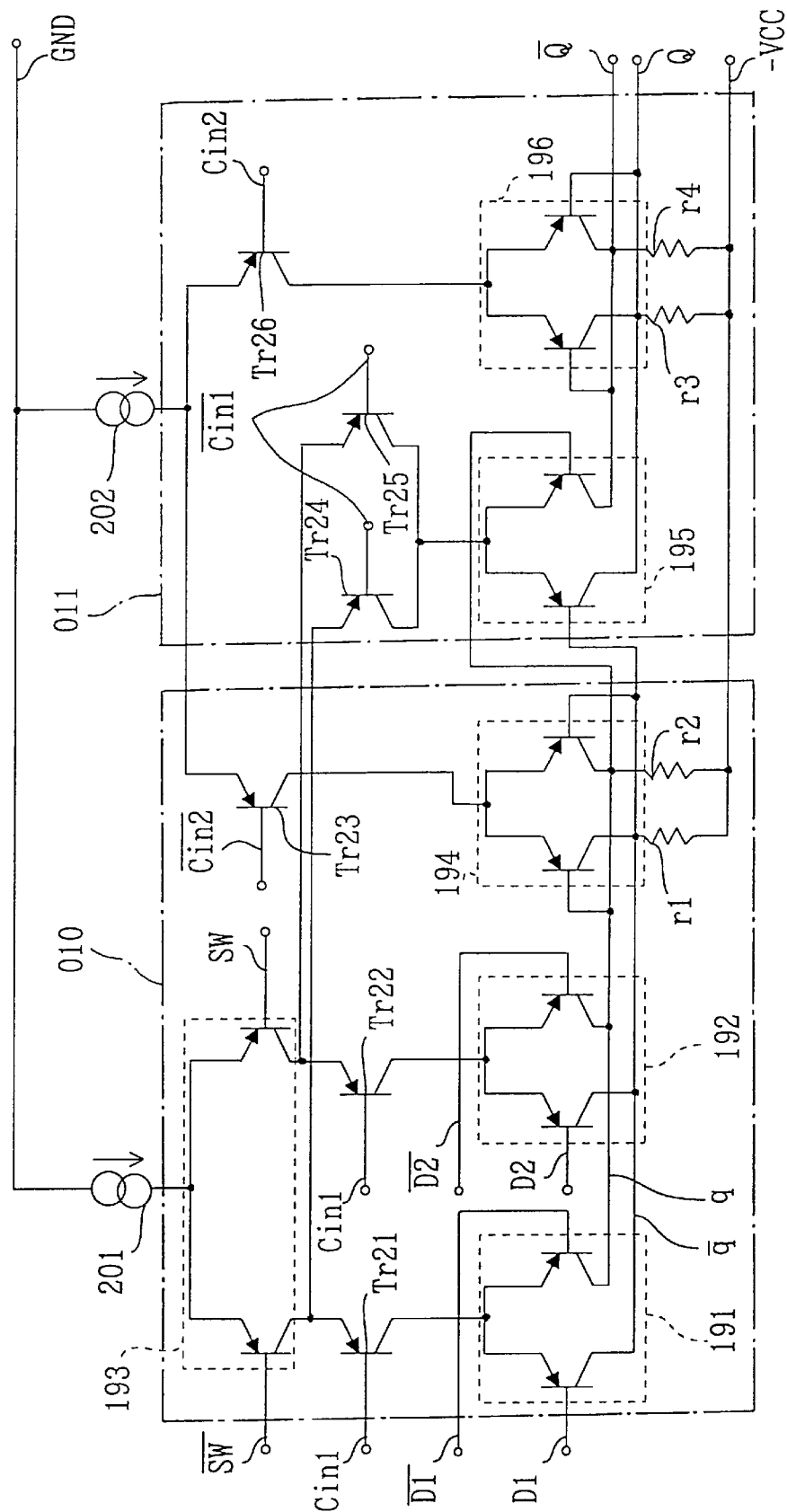
Figure 20:
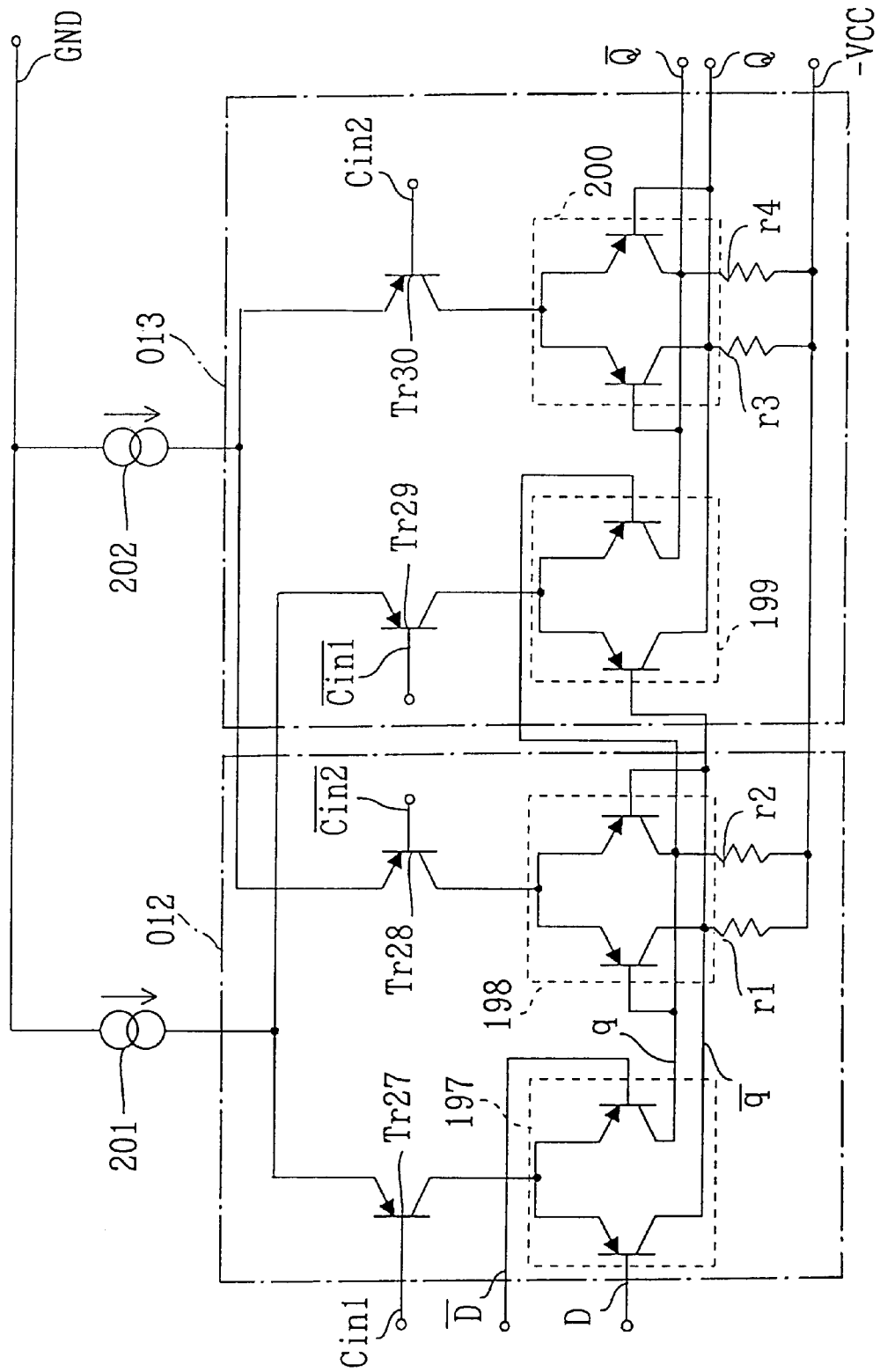

In the embodiments described above, each D-type flip-flop is made up of npn bipolar transistors. The invention is not limited to this design. Each D-type flip-flop may also be constructed from pnp bipolar transistors. For example, if the transistors of the D-type flip-flops DF1, DF2 are replaced by the pnp type, D-type flip-flops shown in FIGS. 19 and 20 are obtained. These D-type flip-flops have master circuits 010 and 012, respectively, corresponding to the master circuits 03 and 05, respectively. Slave circuits 011 and 013 correspond to the slave circuits 04 and 06, respectively. Differential circuits 191–200 correspond to the differential circuits 1–10, respectively. Pnp transistors Tr21 and Tr22 correspond to the transistors Tr7 and Tr8, respectively. Pnp bipolar transistors Tr23–Tr30 correspond to the transistors Tr11–Tr18, respectively. Constant-current circuits 201 and 202 are made up of pnp bipolar transistors (not shown). A frequency dividers consisting of these D-type flip-flops produce advantages similar to those produced by the frequency divider consisting of the D-type flip-flops DF1, DF2.

Each D-type flip-flop may be made up of MOS transistors. In this case, the second and following stages may be made of ordinary MOS transistors. The first stage may have an input portion constructed as shown in FIG. 21.

Figure 21:
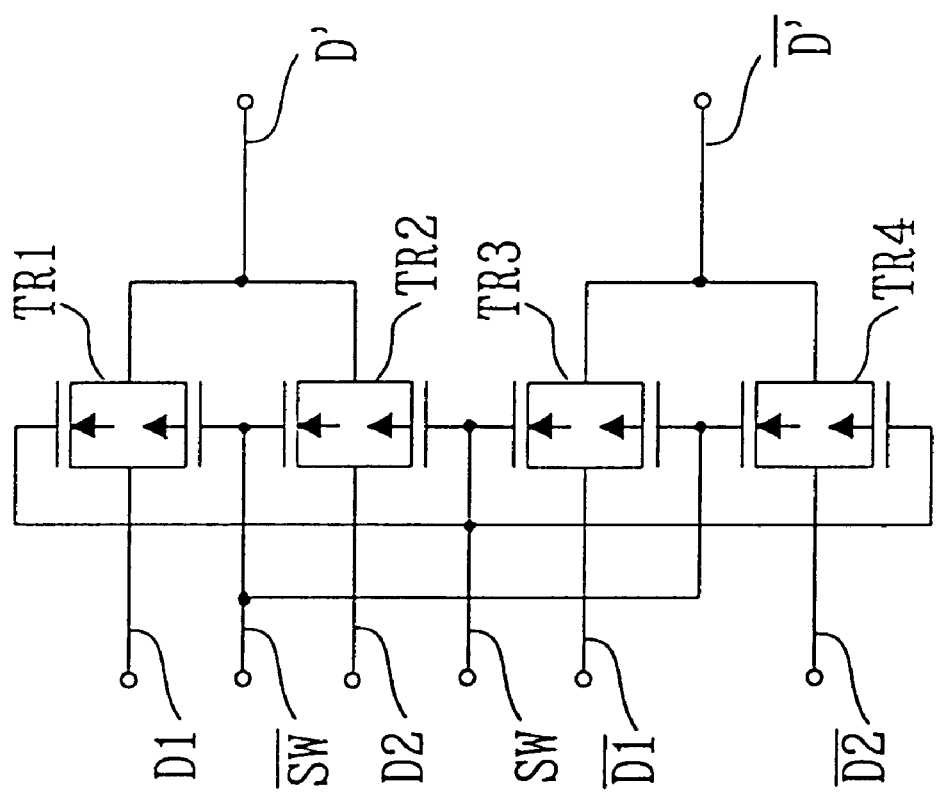
Figure 22:
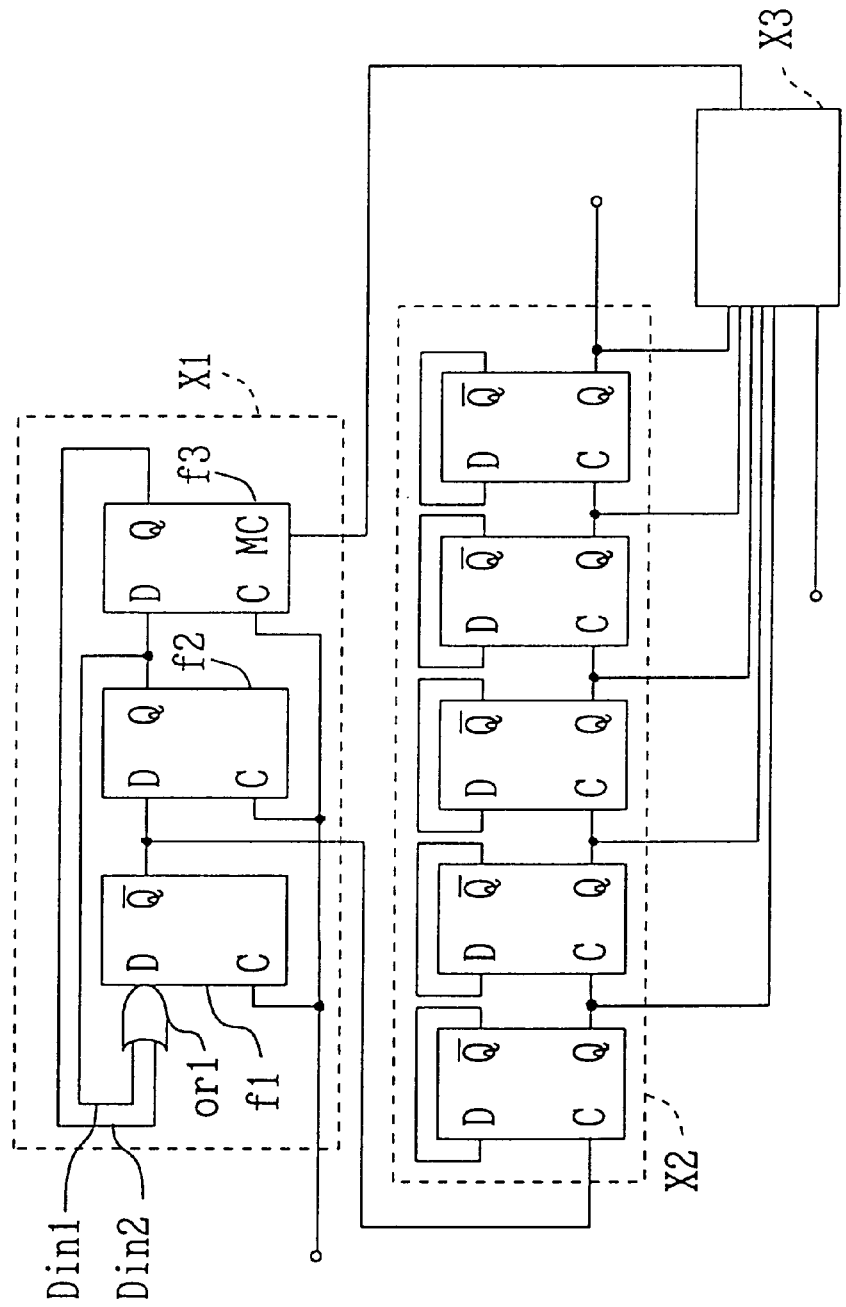

In FIG. 21, there are shown transmission gates TR1–TR4. The inputs of the transmission gates TR1 and TR2 are connected with terminals D1 and D2, respectively. The outputs of the transmission gates TR1 and TR2 are connected with a common terminal D'. The inputs of the transmission gates TR3 and TR4 are connected with $\overline{D1}$ and $\overline{D2}$, respectively. The outputs of the transmission gates TR3 and TR4 are connected with a common terminal $\overline{D'}$. Terminals D1 and $\overline{D1}$ are a noninverting output terminal and an inverting output terminal, respectively, of a D-type flip-flop located immediately before the final stage (not shown). The terminals D2 and $\overline{D2}$ are a noninverting output terminal and an inverting output terminal, respectively, of the final stage of D-type flip-flop. The transmission gates of the input portion are enabled and disabled by signals from the terminals SW and $\overline{SW}$, respectively. Transmission gates TR1–TR4 constitute an input portion. Terminals D' and $\overline{D'}$ are connected with the noninverting and inverting terminals, respectively, of the first stage of D-type flip-flop (not shown).

The operation for switching the data input to the first stage of D-type flip-flop is described now. Each transmission gate is enabled and disabled by signals from the terminals SW and $\overline{SW}$. When the signal from the terminal SW assumes level 1, the transmission gates TR1 and TR3 are enabled to send signals from terminals D1 and $\overline{D1}$ to the terminals D' and $\overline{D'}$, respectively. When the signal at the terminal SW takes level 0, the transmission gates TR2 and TR4 are enabled to sent signals from terminals D2 and $\overline{D2}$ to the terminals D' and $\overline{D'}$, respectively. In this input portion, data are not interrupted at whatever timing. Furthermore, the transmission gates TR1–TR4 can be regarded as resulting in no delay. Hence, this can produce the same advantages as the aforementioned D-type flip-flop DF1. That is, where a frequency divider is constructed from D-type flip-flops of this MOS configuration, advantages similar to those derived from the embodiments described above can be had.

In the present invention, the first stage of D-type flip-flop selectively accepts the outputs from the Nth and (N–1)th stages of D-type flip-flops according to the logic level of the output from the Nth stage of D-type flip-flop. This eliminates delay among the first stage of D-type flip-flop, the Nth stage of D-type flip-flop, and the (N–1)th stage of D-type flip-flop. Therefore, the operating frequency can be enhanced. That is, delay elements in a frequency divider can be limited almost to D-type flip-flops themselves. Therefore, full use of the high-speed capability of D-type flip-flops can be made.

Electric currents are supplied to the input portion and the output portion of the circuit of each D-type flip-flop, whether the circuit is a master circuit or a slave circuit, in response to the first and second clock signals. The input portion accepts data. The output portion holds and delivers the input data. The first clock signal is delayed by a given amount with respect to the second clock signal. In consequence, the timing at which input data is written and the timing at which the data is held are optimized. This permits increase of the operating frequency. These D-type flip-flops can make full use of the high-speed operating capability of the frequency divider in accordance with the present invention.

In this structure, the signal corresponding to the logic level of the output from the Nth stage of D-type flip-flop used to switch the input data is allowed to be delayed. Therefore, this signal used for switching can be applied to the first stage of D-type flip-flop via other logic elements. Hence, the frequency circuit can be easily combined with other logic elements. Since the switching signal is permitted to be delayed, the frequency divider operates stably at high speeds and thus produces fewer malfunctions. In other words, the operating frequency of the frequency divider can be enhanced.

When the output from the Nth stage of D-type flip-flop is switched, data of the same logic level is supplied to the input of the first stage of D-type flip-flop, whether the output from the Nth stage or the output from the (N–1)th stage is selected. Therefore, the input data is not interrupted irrespective of the timing at which the signal for switching the input data is applied. This regulates the operation of the frequency divider.

What is claimed is:

1. A frequency divider comprising N (three or a greater integer) stages of D-type flip-flops cascaded and receiving an incoming clock signal, said D-type flip-flops acting to cyclically shift data according to the incoming clock signal to achieve frequency division of said clock signal;

said N stages of D-type flip-flops including a first stage of D-type flip-flop, an (N–1)th stage of D-type flip-flop, and an Nth stage of D-type flip-flop; and said first stage of D-type flip-flop selecting an output from said Nth stage of D-type flip-flop or an output from said (N–1)th stage of D-type flip-flop according to logic level of an output from said Nth stage of D-type flip-flop, whereby achieving a frequency division with frequency division ratio of (2N–1).

2. The frequency divider of claim 1, wherein outputs from all the D-type flip-flops assume a first logic level at every (2N–1) clock pulses, the first stage of D-type flip-flop accepts the output from the (N–1)th stage of D-type flip-flop as input data when the output from said Nth stage of D-type flip-flop is at the first logic level, and the first stage of D-type flip-flop accepts the output from said Nth stage of D-type flip-flop when the output from said Nth stage of D-type flip-flop is at a second logic level.

3. The frequency divider of claim 1, wherein when the output from the Nth stage of D-type flip-flop is switched, data of the same logic level is supplied to the first stage of D-type flip-flop, whether the output from the Nth stage or the output from the (N–1)th stage is selected.

4. The frequency divider of claim 1, wherein said first stage of D-type flip-flop comprises a first input portion consisting of a first differential circuit for producing an output according to the output from said (N–1)th stage of D-type flip-flop, a second differential circuit for producing an output according to said Nth stage of D-type flip-flop, and a third differential circuit for supplying complementary currents to said first and second differential circuits according to the output from said Nth stage of D-type flip-flop, outputs of said first and second differential circuits having the same logic level as noninverted inputs of said first and second differential circuits being connected to each other, and outputs of said first and second differential circuits having the same logic level as inverted inputs of said first and second differential circuits being connected to each other, to produce complementary input data.

5. The frequency divider of claim 4, wherein said first stage of D-type flip-flop is of a master-slave type and comprises a first master circuit and a first slave circuit, said first master circuit comprises said first input portion and a first output portion consisting of a fourth differential circuit for holding data input to said first input portion and producing the held data as output, said first slave circuit comprises a second input portion consisting of a fifth differential circuit for accepting the output from said first master circuit and a second output portion consisting of a sixth differential circuit for holding the data input to said second input portion and sending the data to a following stage of D-type flip-flop, each of said second and following stages of D-type flip-flops is of a master-slave type and comprises a second master circuit and a second slave circuit, said second master circuit comprises a third input portion consisting of a seventh differential circuit for accepting output from the previous stage and a third output portion consisting of an eighth differential circuit for holding the data input to said third input portion and producing the held data as output, said second slave circuit comprises a fourth input portion consisting of a ninth differential circuit for accepting the output from said second master circuit and a fourth output portion consisting of a tenth differential circuit for holding data input into said fourth input portion and producing the data to a following stage of D-type flip-flop, electric current is supplied to said first differential circuit or said second differential circuit and the fifth differential circuit alternately according to the first clock signal in said first input portion and in said second input portion, electric current is supplied to said fourth and sixth differential circuits alternately according to the second clock signal in said first and second output portions, electric currents are supplied to the seventh and ninth differential circuits in synchronism with supply of electric currents to said first or second differential circuit and said fifth differential circuit, respectively, according to said first clock signal in said third and fourth input portions, electric currents are supplied to the eighth and tenth differential circuits in synchronism with supply of electric currents to the fourth and sixth differential circuits, respectively, according to the second clock signal in said third and fourth output portions, and said first clock signal is delayed by a given amount with respect to said second clock signal.

* * * * *